(12) United States Patent
Wyatt

(10) Patent No.: US 10,408,426 B2
(45) Date of Patent: Sep. 10, 2019

(54) METHOD AND APPARATUS TO ENHANCE SPECTRAL PURITY OF A LIGHT SOURCE

(71) Applicant: PixelDisplay Inc., San Jose, CA (US)

(72) Inventor: David Wyatt, San Jose, CA (US)

(73) Assignee: PIXELDISPLAY INC., San Jose, CA (US)

( * ) Notice: Subject to any disclaimer, the term of this patent is extended or adjusted under 35 U.S.C. 154(b) by 0 days.

(21) Appl. No.: 15/074,916

(22) Filed: Mar. 18, 2016

(65) Prior Publication Data
US 2017/0269279 A1 Sep. 21, 2017

(51) Int. Cl.
| F21V 9/30 | (2018.01) |
| F21V 8/00 | (2006.01) |
| F21K 9/64 | (2016.01) |
| H01L 33/00 | (2010.01) |
| H01L 33/46 | (2010.01) |
| H01L 33/50 | (2010.01) |

(52) U.S. Cl.
CPC ............ *F21V 9/30* (2018.02); *F21K 9/64* (2016.08); *G02B 6/005* (2013.01); *G02B 6/0026* (2013.01); *H01L 33/00* (2013.01); *H01L 33/46* (2013.01); *H01L 33/502* (2013.01); *H01L 33/50* (2013.01)

(58) Field of Classification Search
CPC ............ F21K 9/64; F21K 9/62; G02B 6/0026
See application file for complete search history.

(56) References Cited

U.S. PATENT DOCUMENTS

| 2010/0149814 A1 | 6/2010 | Zhai et al. |
| 2010/0283914 A1 | 11/2010 | Hamada |
| 2011/0245820 A1* | 10/2011 | Papac ................. A61B 1/0653 606/15 |
| 2013/0021793 A1 | 1/2013 | Zimmerman et al. |
| 2013/0044280 A1 | 2/2013 | Asaoka et al. |
| 2013/0279151 A1* | 10/2013 | Ouderkirk ............ H01L 33/507 362/84 |
| 2015/0049486 A1 | 2/2015 | Jung et al. |

OTHER PUBLICATIONS

PCT International Search Report and Written Opinion dated Nov. 21, 2016, International Application No. PCT/US2016/023301, Filed Mar. 18, 2016, David Wyatt, 22 pages.

* cited by examiner

Primary Examiner — Sean P Gramling
(74) Attorney, Agent, or Firm — Haverstock & Owens LLP

(57) ABSTRACT

A reflective filter serving as a multi-bandpass filter for a light source configured to emit light in a plurality of color primary wavelengths to improve color purity. The addition of a reflective/recirculation assembly reinforces and recirculates light not passed by the multi-bandpass filter back into a desired spectrum, which is subsequently passed by the multi-bandpass filter, or converts light not passed by the multi-bandpass into electrical energy for use by the system. The reflective filter, solely or along with the recirculation assembly, can be placed adjacent a conventional light source. Alternatively the multi-bandpass filter and the recirculation assembly can be placed in a modified light source, or placed in an optical stack along the path of light emission. Collimating structures that enforce the light into desired incident angle of attack onto the reflective filter can be included to enhance the efficiency of the reflective elements in the assembly.

32 Claims, 20 Drawing Sheets

Dichroic RGBcy BandPass

METHOD AND APPARATUS TO ENHANCE SPECTRAL PURITY OF A LIGHT SOURCE

FIELD OF THE INVENTION

The present invention relates generally to light sources, and more specifically to enhancing the purity of the spectral components of a light source.

BACKGROUND OF THE INVENTION

Many lighting fixtures, portable lights and display panels use white light emitting diodes (LED's) as light sources. White LED's can be constructed from junctions of various semiconductor material to produce different color spectral-peaks (wavelength bands of significant emissions) of light. The more efficient (on a watts/lumens basis) white LED's have followed the path invented by Shuji Nakamura, and pioneered by Nichia Corp Japan. These white LED's were based on an Indium Gallium Nitride (InGaN), AlGaInP and similar GaN junctions, characterized by constituting a blue photon pump and a companion phosphor within the LED assembly, or located remotely but within the light path of the photon-pump. The emission of blue light (in the 430~465 nm range) being partially absorbed by the phosphor particles (e.g. YAG phosphor, comprising of rare earth metal Yttrium, and Aluminium, Oxygen $Y_3Al_5O_{12}$) and re-emitted in a lower, broad wavelength range, centered around yellow 552 nm (e.g., exhibiting the Stokes shift, down-converting higher-energy blue light photons, into longer wavelength photons). The combination of blue and broad-yellow re-emissions generates what appears to a typical human eye to be white light, by virtue of the use of complementary blue and yellow colors (e.g., the broad spectrum shown at the top right of FIG. 2).

One challenge of a Blue+YAG LED is that a blue-ish tint can be perceived from these nominally "white" LED's. This tint is exacerbated over time if the proportion of yellow produced by the YAG is reduced, or fades, or if the dominant spectral peaks shift with age. Another change causing a perceived shift away from white light can be blue emissions from the photon pump fluctuating in wavelength or intensity, for example with supply forward-voltage/current, temperature and/or duty-cycle in pulse-width modulation. By any means, producing an imbalance in the ratio of the specific blue and yellow dominant spectral wavelengths or amplitudes alters the color ratio required to produce the desired shade of white—termed the "white point." Typically, the white-Point is expressed as either CIE standard reference Illuminant D-point (for example D65, or D50), or as a "color temperature" in degrees Kelvin (for example D65=color temperature of 6504K).

Another challenge for forming high-performance white LED's is the reliance on rare-earth metals (e.g., Yttrium), which are geographically sparse, creating a heavy dependence on a single region. Alternative phosphor arrangements based on a combination of red silicon nitrides (as per GE Corporations "KSF" phosphor) and green silicon alumina nitride (as per α and β-SiAlON phosphor from Fujikara Corp.) have emerged in the space, producing richer white through stronger, narrower red & green dominant primaries. The new phosphors come with additional challenges in that the emission characteristics are uneven, and degrade more quickly at independent aging rates. What is desirable is a solution that can produce a selected color temperature of white light through selective primaries, using existing or more readily available phosphor materials.

Organic LED's (OLED's), which are based on emissions of organic materials (instead of the Inorganic materials used in LED junctions), are rising in popularity as well due to improvements in intensity, luminosity per-mm$^2$ and per-Watt, and are competing with LED's as another viable light source. The challenges with OLED as a light source are similar to those of LED's, and further the organic electro-luminescent or electro-phosphorescent materials tend to aging more quickly (for example dropping 10% in less than 1,000 hrs), accelerated through the action of oxidization and humidity. Additionally, the materials used for the primary colors have different efficiency and aging rates—blue in particular aging as much as twice as fast as green, which degrades 10% faster than red—each affecting the color balance as the primaries degrade differently. What is desirable is a solution that can produce a more stable selected color temperature of white light, through regulated primary emission.

Conventional lighting strategies for electronic liquid crystal displays (LCDs) provide for illumination for the display in one of three modalities: direct backlight, front lit and edge lit. A direct backlight is configured with a light source (e.g. a LED, OLED or Electroluminescence (EL) layer) positioned directly behind a pane of the display (typically a glass pane), such that illumination from the light source transmits through the pane. For a front lit system the light source is placed substantially in front of the viewing plane, typically in the front bezel along the inside-edge. Light from the front light passes into the display plane, through an optical stack, reflects off the back-reflector and then passes out again through the pixels. An edge lit backlight positions the light source at one or more edges of a device, and is designed to conserve both thickness, space, and power consumed by the device. A typical edge lit backlight has structure as depicted in FIG. 1, which illustrates a schematic overview and cross-section of an edge-lit backlight and display. The display and edge lit backlight 20 are shown in cross-section A-A. A light source 22 (e.g., an LED, OLED, CCFL, Laser or EL) is positioned along an edge of the display, and can be housed within a housing 24. The light source 22 is positioned such that light emitted is directed toward an optical stack 26 of the display, the optical stack 26 typically including a number of layers. A light guide 28 is configured to direct illumination from the light source 22 across the breadth of the display. The light directed from the light guide passes through layers of the optical stack 26, which can include, for example, a diffuser layer 30, a brightness enhancement layer 32 (e.g., brightness enhancement film (BEF)), a first polarization film 34, a liquid crystal film 36, and a second polarization film 38.

Typically, the light source 22 includes LEDs in a backlight bar (for example, a string of LEDs along a PCB), arranged along an edge of the display. The LEDs can be arranged along one, two, or all four edges of the display. As light from LEDs is directed into the light guide 28 (which is often wedge-shaped), a series of microdivots along an exiting face of the light guide 28 causes light to scatter, directing some of the light to go forward through the polarization films 34 and 38, along with the liquid crystal film 36 (the combination of polarization films 34 and 38, and the liquid crystal film 36 can be referred to as an "LC stack"). Often the light guide 28 includes a reflective surface (e.g., ESR) to reflect light from back side of the light guide wedge toward the illumination side of the display. While edge- or direct backlighting may be used for any LCD display, direct backlighting solutions do not require a light guide and tend to be more efficient at directing light energy through the optical stack to the viewer. However, direct backlight solutions are thicker and heavier and thus these configurations are typically only used for TVs and computer monitors where display thickness is not as critical. Edge lit configurations are often used for mobile devices, tablets, and laptops where weight and reduced thickness of the overall display is more important, and there is insufficient room for a direct lighting solution.

A principle of operation for a liquid crystal display is to sample light with an aperture comprising two linear polarizers, and a polarization-controlling liquid crystal, in the optical stack. In one LCD embodiment there is only one layer that relates to the color developed in the display, that being the color filter. That is, what is displayed on the LCD in terms of color, and the range of colors (e.g., the color gamut), is determined by the purity of the light source, and the color filter that is present. In other LCD embodiments, for example those using color-field-sequential displays, there is no color filter, the LC layer still operates as an aperture, however the light source is selectively alternated to display each of the primary colors in repeating order, in sync with the moment of displaying the pixels of the frame in that primary color. By either means the light source is therefore an important element in determining the color and quality of the image seen on an LCD display.

FIG. 2 depicts an exemplary formulation of red, green, and blue primary colors for an LCD using a white light source in a conventional backlight. The light source shown is a white LED, which is the primary light source in a modern display. In LCD display panels, this broad-spectrum white light is filtered in the display by color filters at selected central wavelengths, typically corresponding to red, green, and blue wavelengths (e.g., 640, 532, and 467 nm). The incident illumination from the light source dictates the characteristics of each of the color filters, both in the amount of absorption of incident illumination required, and in the breadth of the color filter (in terms of wavelengths passed). The illumination from the light source, filtered by the color filters, forms display primaries that are intended to be perceptually significant in intensity, so as to display the target color temperature of white (an expression of the hue and shade of white, based on the spectral emission characteristics at the given temperature of a black-body emitter), when used in unison, but having broad spectrums centered about the desired wavelengths.

Such light sources when used in conventional display backlights lead to relatively poor color saturation and intensity at the desired primary wavelengths of the display. The cause being the wavelength spread of the primary colors being too broad, and not concentrated sufficiently at the desired wavelengths spectrum to produce crisply defined tri-axial points from which can be rendered a gamut of colors. The conventional color filters included in the display break up the light source spectrum into separate colors on the display (e.g. in subpixel components of red, green, and blue) by absorbing light energy not of the desired spectral range, typically expending the absorbed energy as heat. Conventional efforts to improve the color of the display have increased the role of the color filter by increasing the thickness of the color filters as band-pass filters, or by use of filter material with stronger absorption characteristics. While this can make the range of wavelengths centered about the desired wavelengths spectrum narrower (in terms of the passband), because the color filter is an absorptive filter, a thicker filter is needed to create a narrower bandpass, which reduces further still the amount of light transmitted through the filter and ultimately through the display. Additionally there is a physical limit to the thickness which a conventional color filter can be increased in an LCD color filter before it exceeds the space available in the coating area of the optical assembly. For example, in order to achieve the Digital Cinema Initiative DCI-P3 standard for color gamut, the filter thickness required in a conventional backlight can result in an additional 50~75% reduction of transmitted light from light source, and thereby a 2×~3.5× increase in backlight power can be required to produce an equivalent brightness to a narrow gamut display. Moreover higher brightness requires more LED's, a wider bezel to contain more LED's, higher power, more cooling, and larger battery to maintain equivalent product operating time for portable system—all of which contributing to higher system cost, greater weight and reduced product user-friendliness. It is desirable to solve the challenge of producing wider color gamut with higher efficiency rather than simply increasing brightness and backlight power.

In LED array display panels, the individual pixels are constructed from groups of LED's. For example each pixel includes one LED for each of the primary colors of the sub-pixel. Such LED displays are typically used in wall displays or outdoor street advertising where brightness and size are required. In some embodiments each sub-pixel primary color LED contains a phosphor stimulated by a diode junction photon pump to emit in the desired primary color spectrum. In some configurations the primary color is achieved through tuning the junction material, and design of the photon-pump, to emit directly in the desired spectral range. The color spectrum output of such LED embodiments is variable due to design and operating factors over the life of the LED, such as the voltage applied at the diode junction. Alternatively, in LED's with phosphor elements, increased temperature of the phosphor causes a quenching effect that diminishes relative output and thereby the color balance between photon-pump and phosphor. The percentage duty cycle use of one primary color LED compared to other primaries alters the relative color output of each pixel group, causing a shift in white balance and color reproduction. The ability to tune operating spectral emission ranges of LED primaries to constrain at specific desired wavelengths, regardless of aging and usage characteristics, is highly desirable.

In OLED display panels of one configuration, the individual pixels are created from organic phosphor sub-pixels of each primary color (e.g. red, green, blue), where each sub-pixel color emission comes from an organic phosphor stimulated by electric potential generated in the display backplane. In OLED display panels of a secondary configuration, the pixel includes one or more organic phosphor elements producing white emission at each sub-pixel, which is then filtered by a color filter layer arranged to pass wavelengths of the desired primary colors for each sub-pixel—similar in function to the Color Filter in an LCD. In both configurations a key challenge for OLED arises as the individual sub-pixel elements age, in particular the sub-component organic phosphors age differently, for example blue phosphor tends to degrade faster than red or green. Additionally, the relative use of each sub-pixel can disproportionally accelerate the shift in emission spectrum according to the amount of relative usage. Hence color non-uniformity and even "image sticking" are common problems whereby the color emission degradation over time becomes visibly noticeable to a typical human eye. The ability to tune operating spectral emission ranges of OLED primaries and constrain emission to specific desired wavelengths, regardless of aging, and usage characteristics, is highly desirable.

In the secondary OLED configuration, the spectral output of white sub-pixel OLED's is again limited by the absorption characteristics in the absorptive color filter. The color gamut is dependent on the primaries thus filtered, and the energy absorbed by the color filter, which is effectively wasted, lost in heat. Current OLED displays have reached limit of around 90~100% of NTSC, and are not currently capable of rendering a wider color gamut, such as is needed for DCI-P3 or BT. 2020, which has been achieved with competing LCD technology using Quantum Dot particles. OLED displays have deeper blacks and better contrast ration than LCD's, and tend to have lower power in mobile applications. It would be advantageous to achieve an equally wide color gamut for OLED displays.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Aspects of the present disclosure provide a method and device capable of improving transmitted color purity of light emission via a reflective multi-bandpass filter, for example enhancing the color purity of a display backlight light source and thereby the color gamut on a display panel, optionally while improving the brightness of the display panel via intermediate recycling of unused reflected light wavelengths. The source can be used as a back-light shining through an imaging layer such as in a Liquid Crystal Display panel, or as a front-light reflecting off an imaging layer such as in an eInk display. The light can be one of a plurality of lights used to cover segments or regions of a display. The light can be individual pixels as in an LED array display or an OLED display device. Additionally the light source can be a standalone light source, such as that found in a room, or in a streetlamp.

For convenience, aspects of the present disclosure are discussed in the context of lighting for a display. It will be appreciated by those of skill in the art that the embodiments described are exemplary, and that further embodiments are consistent with the spirit and scope of the present disclosure. For example, while the discussion herein regarding lighting of a display panel is directed toward an LED light source, embodiments according to the present disclosure are also able to be directed toward display modalities including OLED, EL, cold-cathode fluorescent light (CCFL), cathode-ray phosphorescence (CRT), incandescent light, laser, or any other light source. Likewise, while for convenience the description herein is directed toward an edge-lit backlight display, embodiments of the present disclosure are readily adapted to be compatible with direct backlight and front lit displays, as well as to applications in overhead lighting and projective light.

Further, the present disclosure is not limited to light sources for displays. At a basic level, embodiments according to the present disclosure are able to be adapted to preferentially configure the output illumination of a general light source, by passing a selected single- or multi-band of accepted wavelengths of the light source and by rejecting, via reflection, wavelengths outside the accepted band(s). Some embodiments include an energy recycling functionality, whereby wavelengths initially out-of-band are translated into in-band wavelengths, which are passed by the selection filter. In this manner conceivably any light source output can be modified, such as that of indoor lighting or a street light. Consider for example a street light with a light source having a first native output spectrum. By filtering and/or recycling output illumination of the street light, one or both of the final output spectrum (e.g., apparent color spectrum) and energy efficiency of the street light can be enhanced. This can allow for a light source having an undesirable native spectrum but an efficient (or less expensive) operation, where an apparatus according to the present disclosure is able to modify the undesirable native spectrum to a preferred apparent color spectrum—e.g., to enhance the yellow-orange spectrum emission, relative to the blue spectral emissions, or conversely to shift-lower or decrease the spectral blue output range. This can be desirable for example in order to minimize disruption on natural circadian rhythms on plants, animals, humans and other organisms, as caused by night lights with an unnaturally large blue component.

An embodiment of the present disclosure includes a reflective filter serving as a multi-bandpass filter for light source illumination to improve color primaries in a backlight for a display. The addition of a reflective/recirculation assembly reinforces and recirculates illumination not passed by the multi-bandpass filter back into the apparatus for conversion into a desired spectrum, which is subsequently passed by the multi-bandpass filter. The reflective filter, solely or along with the recirculation assembly, can be placed adjacent a conventional light source. Alternatively the multi-bandpass filter and the recirculation assembly can be placed internal to a modified light source, or placed in an optical stack of a backlight or frontlight assembly. Collimating structures that enforce the light into desired angles of attack onto the reflective filter can be included, for example to enhance the efficiency of reflective filters constructed from dichroic filter layers in an embodiment.

More specifically, an aspect of the present disclosure provides a light recycling assembly for enhancing spectral purity of transmitted light of a display, including a first dichroic filter disposed in a light path of a light source and operable to transmit light over a first passband of wavelengths, and to reflect wavelengths not of the first passband. The light recycling assembly includes a conversion element including at least one conversion particle, disposed to receive reflected light from the first dichroic filter, and operable to absorb light at a first conversion wavelength and to emit light at a wavelength of the first passband.

In an embodiment the light recycling assembly includes a reflecting element disposed to received emitted light of the conversion element and reflected wavelengths of the first dichroic filter, and operable to direct reflected light toward the first dichroic filter. In an embodiment the light recycling assembly includes a display color filter, the display color filter integrating the first dichroic filter. In an embodiment the light recycling assembly includes a photovoltaic conversion element including a particle operable to absorb light at a conversion wavelength band and to convert at least a portion of the conversion wavelength light into electrical energy. In an embodiment the light source includes a photon pump operable to emit at photon pump wavelengths, and the reflecting element includes a second dichroic filter operable to transmit a second passband of wavelengths that includes photon pump wavelengths and to reflect wavelengths not of the second passband. In an embodiment the conversion element includes a first particle adapted to absorb at least a portion of the photon pump wavelengths and to emit light at conversion wavelengths other than the photon pump wavelengths, and a second particle adapted to absorb light of the conversion wavelengths and to emit light at a wavelength of the first passband. In an embodiment the first dichroic filter, the conversion element, and the second dichroic filter form an arrangement operable to direct light in a light path, the light path including: a first portion wherein light source light is incident upon the second dichroic filter; a second portion wherein transmitted second passband light is incident upon the first dichroic filter; a third portion wherein the first passband light is transmitted by the first dichroic filter toward the illumination side of a display panel; a fourth portion wherein reflected light from the first dichroic filter is incident upon the conversion element; and a fifth portion wherein emitted light from the conversion element is incident upon the second dichroic filter. In an embodiment the first dichroic filter, the conversion element, and the reflective element are substantially coplanar and form an arrangement adjacent to the light source. In an embodiment the first dichroic filter, the conversion element, and the reflecting element are arranged in an optical stack configuration including substantially coplanar layers that are parallel to the illumination side of the display panel, and distal to a light guide with respect to the light source. In an embodiment the light source is disposed in a housing, and the housing includes the reflecting element.

According to another aspect of the present disclosure, a method of recycling light for enhancing the spectral purity of transmitted light of a display includes transmitting light over a first passband of wavelengths by a first dichroic filter disposed in a light path of a light source; reflecting wavelengths not of the first passband, by the first dichroic filter; receiving reflected light from the first dichroic filter by a conversion element including at least one conversion particle; absorbing light at a first conversion wavelength; and emitting light at a wavelength of the first passband.

In an embodiment the method further includes directing reflected light toward the first dichroic filter by a reflecting element disposed to received emitted light of the conversion element and reflected wavelengths of the first dichroic filter. In an embodiment the first dichroic filter forms a part of a display color filter. In an embodiment the method further includes absorbing light at a photovoltaic conversion wavelength, and converting at least a portion of the photovoltaic conversion wavelength light into electrical energy, by a photovoltaic conversion element. In an embodiment the light source includes a photon pump emitting at photon pump wavelengths, and the reflecting element includes a second dichroic filter transmitting a second passband of wavelengths that includes photon pump wavelengths and reflecting wavelengths not of the second passband. In an embodiment the conversion element includes a first particle absorbing at least a portion of the photon pump wavelengths and emitting light at conversion wavelengths other than the photon pump wavelengths, and a second particle absorbing light of the conversion wavelengths and emitting light at a wavelength of the first passband. In an embodiment the first dichroic filter, the conversion element, and the second dichroic filter form an arrangement directing light in a light path, the light path including: a first portion wherein light source light is incident upon the second dichroic filter; a second portion wherein transmitted second passband light is incident upon the first dichroic filter; a third portion wherein the first passband light is transmitted by the first dichroic filter toward the illumination side of a display panel; a fourth portion wherein reflected light from the first dichroic filter is incident upon the conversion element; and a fifth portion wherein emitted light from the conversion element is incident upon the second dichroic filter. In an embodiment the first dichroic filter, the conversion element, and the reflective element are substantially coplanar and form an arrangement adjacent to the light source. In an embodiment the first dichroic filter, the conversion element, and the reflecting element are arranged in an optical stack configuration including substantially coplanar layers that are parallel to the illumination side of the display panel, and distal to a light guide with respect to the light source. In an embodiment the light source is disposed in a housing, and further the housing includes the reflecting element.

According to another aspect of the present disclosure, an assembly for enhancing spectral purity of transmitted light of a display includes: a light source having an output surface operable to output light; a light guide adapted to receive incident light from the light source at a first surface, and to emit light at a second surface; and a dichroic filter interposed between the light source and an illumination surface of a display, the dichroic filter operable to pass a multi-band of wavelengths of transmitted light, and to reflect wavelengths not of the multi-band.

In an embodiment the dichroic filter is disposed adjacent to the light source output surface and between the light source and the light guide. In an embodiment the dichroic filter is disposed within an optical stack between the light guide and the illumination surface of the display. In an embodiment the assembly further includes a collimating structure interposed between the white light source and the dichroic filter and adapted to collimate output light prior to incidence on the dichroic filter. In an embodiment the assembly includes a photovoltaic conversion element including a particle operable to absorb light at a conversion wavelength band and to convert at least a portion of the conversion wavelength light into electrical energy. In an embodiment the multi-band of wavelengths corresponds with wavelengths in the visible spectrum. the dichroic filter consists essentially of a single fixed body.

According to another aspect of the present disclosure, a display system includes a display panel having an illumination surface and a light emitting transmission surface; and a backlight, including: a light source operable to illuminate the illumination surface of the display panel; a first dichroic filter disposed adjacent the light source and operable to transmit light source light over a passband of wavelengths, and to reflect wavelengths not of the passband; a second dichroic filter operable to receive the transmitted passband light and to transmit at least one selected wavelength of the passband, and to reflect other wavelengths; and a recycling element including a particle disposed to receive reflected illumination and operable to absorb at a first wavelength and to emit at the at least one selected wavelength of the passband. The first dichroic filter, the second dichroic filter, and the recycling element form an arrangement disposed between the light source and the illumination side of the display panel.

In an embodiment the recycling element includes a first particle adapted to absorb light source wavelengths, and to emit recycled light at a wavelength not of the passband wavelengths, and a second particle adapted to absorb recycled light and to emit light at a wavelength of the passband. In an embodiment the recycled light is of a shorter wavelength than the light source wavelengths. In an embodiment the recycled light is of a longer wavelength than the light source wavelengths. In an embodiment the light source wavelengths are visible wavelengths and the first particle is adapted to emit light at invisible wavelengths, and wherein the second particle is adapted to absorb light of invisible wavelengths. In an embodiment the first particle and the second particle are disposed in adjacent deposition layers, and wherein the first dichroic filter and the second dichroic filter are substantially coplanar having the adjacent deposition layers disposed therebetween. In an embodiment the first dichroic filter, the second dichroic filter, and the recycling element form an arrangement defining a light path for light source illumination, the light path including: a first portion wherein light source illumination is incident upon the first dichroic filter; a second portion wherein transmitted passband illumination is incident upon the second dichroic filter; a third portion wherein the at least one selected wavelength is transmitted by the second dichroic filter toward the illumination side of the display panel; a fourth portion wherein reflected light from the second dichroic filter is incident upon the recycling element; and a fifth portion wherein emitted light from the recycling element is incident upon the first dichroic filter. In an embodiment the passband includes wavelengths in the visible spectrum. In an embodiment the second dichroic filter is operable to reflect IR wavelengths. In an embodiment the system further including a light source conversion layer disposed between the first and the second dichroic filters, wherein the light source includes a photon pump and wherein the light source conversion layer is operable to convert photon pump wavelengths into visible wavelengths. In an embodiment a photovoltaic conversion element including a particle operable to absorb light at a conversion wavelength band and to convert at least a portion of the conversion wavelength light into electrical energy.

According to another aspect of the present disclosure, a display light assembly includes a light source operable to illuminate an illumination side of a display panel; a dichroic filter disposed in a light path of the light source and operable to transmit light over a first passband of wavelengths, and to reflect wavelengths not of the first passband; a recycling element including at least one particle disposed to receive reflected light from the dichroic filter, and operable to absorb light at a first wavelength and to emit light at a second wavelength; and a reflecting element disposed to receive emitted light of the recycling element and reflected wavelengths of the dichroic filter, and to direct reflected light toward the dichroic filter.

In an embodiment the assembly further includes a display color filter, the display color filter integrating the dichroic filter. In an embodiment the light source includes a photon pump, and the reflecting element includes a first dichroic filter operable to transmit a first transmission passband of wavelengths that include photon pump wavelengths, and to reflect wavelengths not of the first transmission passband, and wherein a second dichroic filter is operable to transmit a second passband corresponding to the first passband of wavelengths, and to reflect light not of second passband. In an embodiment the recycling element includes a first conversion particle adapted to absorb reflected light from the first and second dichroic filters, and to emit light at a third wavelength, and a second conversion particle adapted to absorb light of the third wavelength, and to emit light in at least one wavelength of the first passband of wavelengths. In an embodiment the first dichroic filter, the recycling element, and the second dichroic filter form an arrangement operable to direct light in a light path including: a first portion wherein light source light is incident upon the first dichroic filter; a second portion wherein transmitted second passband light is incident upon the second dichroic filter; a third portion wherein the first passband light is transmitted by the second dichroic filter toward the light side of the display panel; a fourth portion wherein reflected light from the second dichroic filter is incident upon the recycling element; and a fifth portion wherein emitted light from the recycling element is incident upon the first dichroic mirror. In an embodiment the assembly further includes a photovoltaic conversion element including a particle operable to absorb light at a conversion wavelength band and to convert at least a portion of the conversion wavelength light into electrical energy. In an embodiment the assembly further includes a color filter integrating the dichroic filter.

According to another aspect of the present disclosure, an apparatus for enhancing spectral purity of transmitted light includes a housing; a light source disposed in the housing, having a fixed spectrum and an output surface operable to output light; and a dichroic filter disposed in the housing adjacent to the output surface, and operable to pass a first multi-band of wavelengths of transmitted light, and to reflect wavelengths not of the first multi-band.

In an embodiment the first multi-band of wavelengths includes visible wavelengths. In an embodiment the light source is adapted to emit light over a broad emission spectrum. In an embodiment the passband width for passbands of the first multi-band is selected according to a predetermined chrominance or hue ratio of the first multi-band wavelengths. In an embodiment the passband amplitude for passbands of the first multi-band is selected according to a predetermined luminance ratio of the first multi-band wavelengths. In an embodiment a predetermined luminance ratio of the first multi-band wavelengths is generated according to wavelength-specific reflectivity constants of the dichroic filter for wavelengths not of the first multi-band. In an embodiment the housing includes an energy recycling element including at least one conversion material disposed to receive reflected light from the dichroic filter, and operable to absorb and to convert light at a first wavelength into electrical energy. In an embodiment the housing includes a recycling element including at least one conversion material disposed to receive reflected light from the dichroic filter, and operable to absorb light at a first wavelength and to emit recycled light at a second wavelength. In an embodiment the housing includes a reflecting element disposed to receive reflected wavelengths of the dichroic filter and the recycled light. In an embodiment the reflecting element is disposed to direct light toward the recycling element. In an embodiment the reflecting element is disposed to direct light toward an output surface of the dichroic filter. In an embodiment the apparatus further includes a second dichroic filter placed after the recycling element wherein the second dichroic filter is adapted to permit the first multi-band of wavelengths, wherein the first multi-band corresponds with visible wavelengths. In an embodiment the conversion material includes at least one particle exhibiting one of the Stokes effect and the Anti-Stokes effect, the recycling element adapted to absorb light not of the first multi-band of wavelengths, and to convert at least a portion of the absorbed light into a wavelength of the first multi-band of wavelengths. In an embodiment the conversion material comprises one of: phosphors; fluorophores; luminophores; chromaphores; and quantum dot particles. In an embodiment the dichroic filter is deposited on an interior surface of the housing. In an embodiment the light source comprises a plurality of point light sources arranged in a pixel array of a display panel. In an embodiment the plurality of point light sources shares a common housing, and wherein the dichroic filter is disposed between the plurality of point light sources and the housing. In an embodiment a second multi-band of wavelengths is permitted to pass through the dichroic filter. In an embodiment the light source is selected from one of an LED, an OLED, an electroluminescent light, a cold-cathode fluorescent light, a laser, an incandescent light, and a fluorescent light. In an embodiment the apparatus further includes a photovoltaic conversion element including a particle operable to absorb light at a conversion wavelength band and to convert at least a portion of the conversion wavelength light into electrical energy.

In embodiments of the display backlight the light source includes an ultraviolet (UV) photon pump, and the reflecting element includes a first dichroic filter operable to transmit a first passband of wavelengths that includes UV, and to reflect wavelengths not of the first passband. A second dichroic filter is operable to reflect UV wavelengths and permit transmission of a second passband that includes the desired spectral wavelength bands. In an embodiment the light transmitted from the first dichroic element reaches at least one of: phosphor, luminophore, chromaphore, fluorophore, and quantum-dot particles, which are configured to absorb UV wavelengths, and to emit in spectral ranges including wavelengths desired for emission in second passband through the second dichroic filter.

In embodiments the wavelengths correspond to emission peaks localized in at least one of the set of the red, yellow, green, cyan, blue and violet light spectral ranges. However, it will be appreciated that there is no limitation as to the wave-bands or wavelength of the emission peaks, nor restriction to a specific color. For example, while in one embodiment D65 white could be approximated using three primaries: 630 nm (red), 535 nm (green) & 467 nm (blue); in another embodiment the same white-point could be approximated using 630 nm (red), and 495 nm (green-cyan).

In embodiments the backlight further includes a light source conversion layer disposed between the first and the second dichroic filters, wherein the light source includes an ultraviolet (UV) photon pump and wherein the light source conversion layer is operable to convert UV into desired relative emission strength in a desired component spectral ranges. In an embodiment the desired spectral ranges include at least two of a set of; red, yellow, green, cyan, blue, and violet, which together form compound light of the desired spectral purity. In one embodiment the spectral ranges include red, green, and blue, which in proportion, together form white light of the desired color temperature.

BRIEF DESCRIPTION OF THE DRAWINGS

Embodiments of the present disclosure are illustrated by way of example, and not by way of limitation, in the figures of the accompanying drawings and in which like reference numerals refer to similar elements.

DETAILED DESCRIPTION OF THE INVENTION

Figure 1:
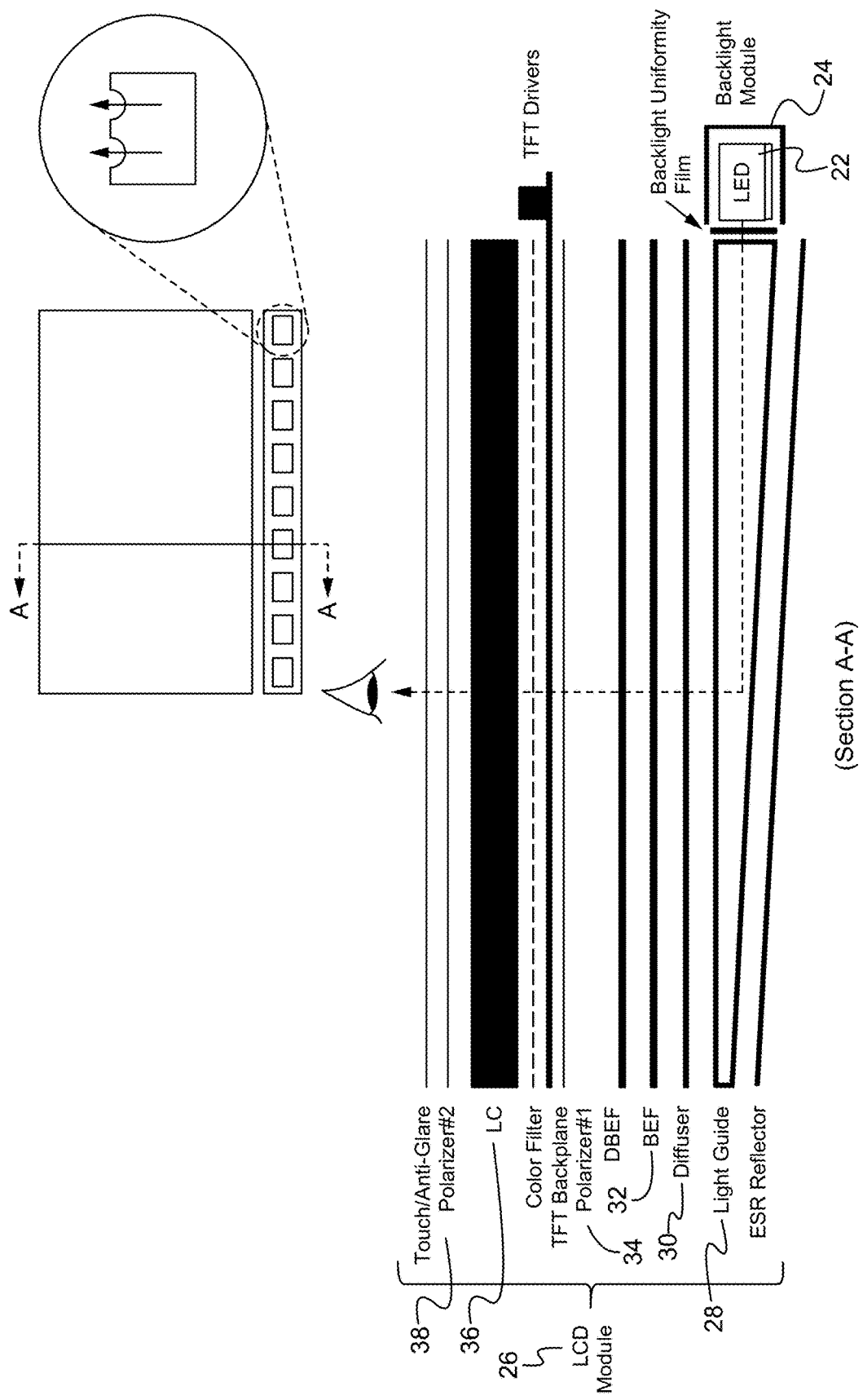
FIG. 1 is a schematic overview and cross-section of an edge-lit backlight and display according to the prior art.
Figure 2:
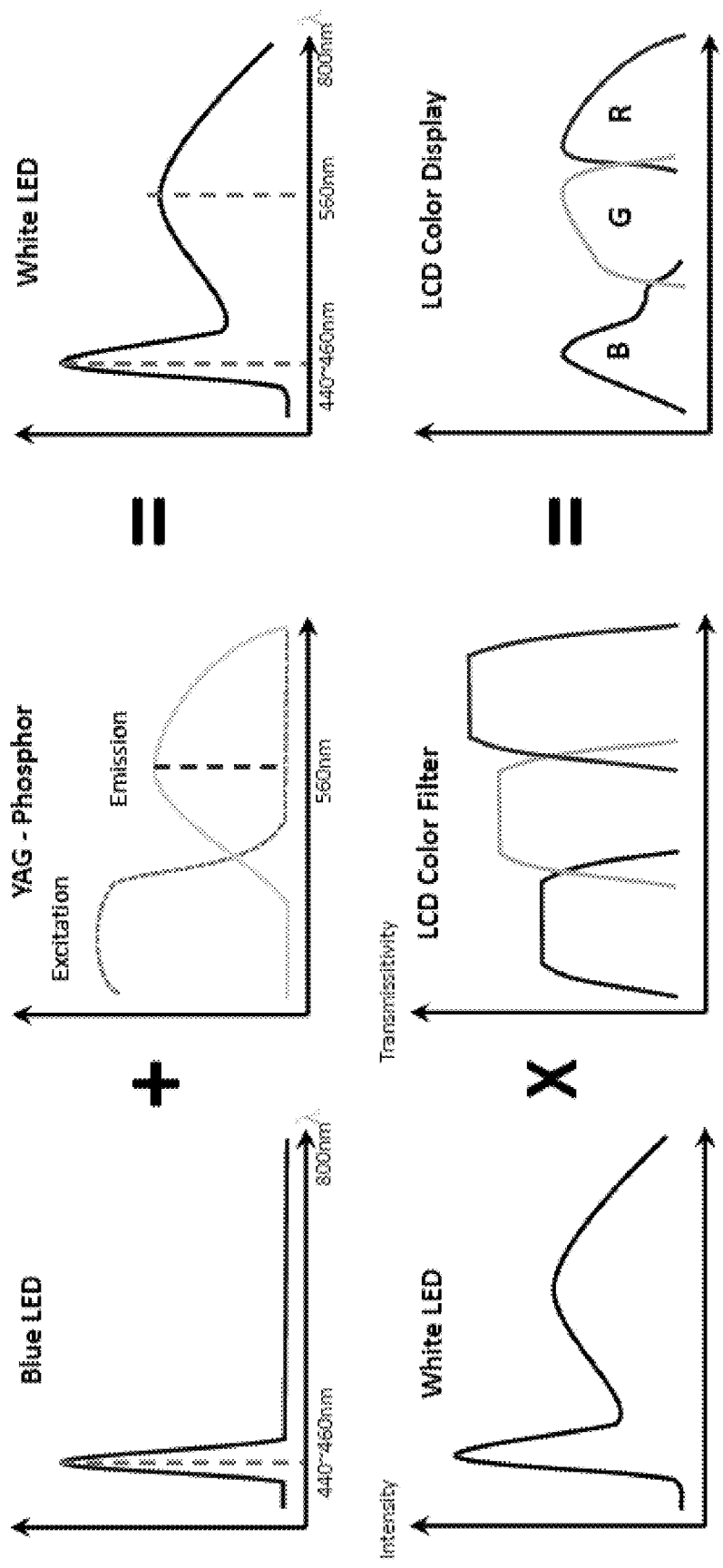
FIG. 2 is a diagram depicting formulation of red, green, and blue primary colors for a display from a white light source in a backlight according to the prior art.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which can be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

In the description the term particle refers to a material of any material state including liquid, solid, plasma, and gas— whether in singular atomic or combined molecular form— and including but not limited to any embodiment as solid particulate layer, film, coating, or suspension. In an embodiment the recycling element contains particles of at least one molecular compound, or quantum energy-level confinement construction, configured to absorb from one spectral wavelength band, and emit photons in a lower wavelength band exhibiting the Stokes shift. Alternatively, by action of the action of the Anti-Stokes effect, a particle can absorb two or more photons, and emit one higher energy higher wavelength photon. In an embodiment the recycling element contains at least one quantum dot particle, configured to absorb from one spectral wavelength band, and emit in another spectral range, by a process typically including but not restricted-to action of the quantum excitron-confinement effect. In an embodiment the recycling particle contains at least one fluorophore compound configured to absorb electromagnetic radiation from one spectral wavelength band, and emit in another lower wavelength band, exhibiting the Stokes shift. In an embodiment the recycling particle is a luminophore containing at least one luminescent molecule configured to absorb electromagnetic radiation from one spectral wavelength band, and emit in another lower wavelength band, exhibiting the Stokes shift. In an embodiment the recycling particle is a chromaphore containing at least one molecule configured to absorb electromagnetic radiation from one spectral wavelength band, and emit in another wavelength band.

As used in the present description, the term "multi-band" or "multi-bandpass" refers to a portion of the electromagnetic spectrum having energy concentrated around at least two central wavelengths. As a non-limiting example, bands of a multi-band can be centered about red (640 nm), green (532 nm), and blue wavelengths (467 nm), respectively. Greater or fewer bands are possible, as are other passband wavelengths. The width of the band can be as narrow as 2 nm, or as wide as 35 nm based on the FWHM (Full-Width at Half-Maximum) measurement, for example.

Increased Backlight Primary Color Saturation

Figure 3:
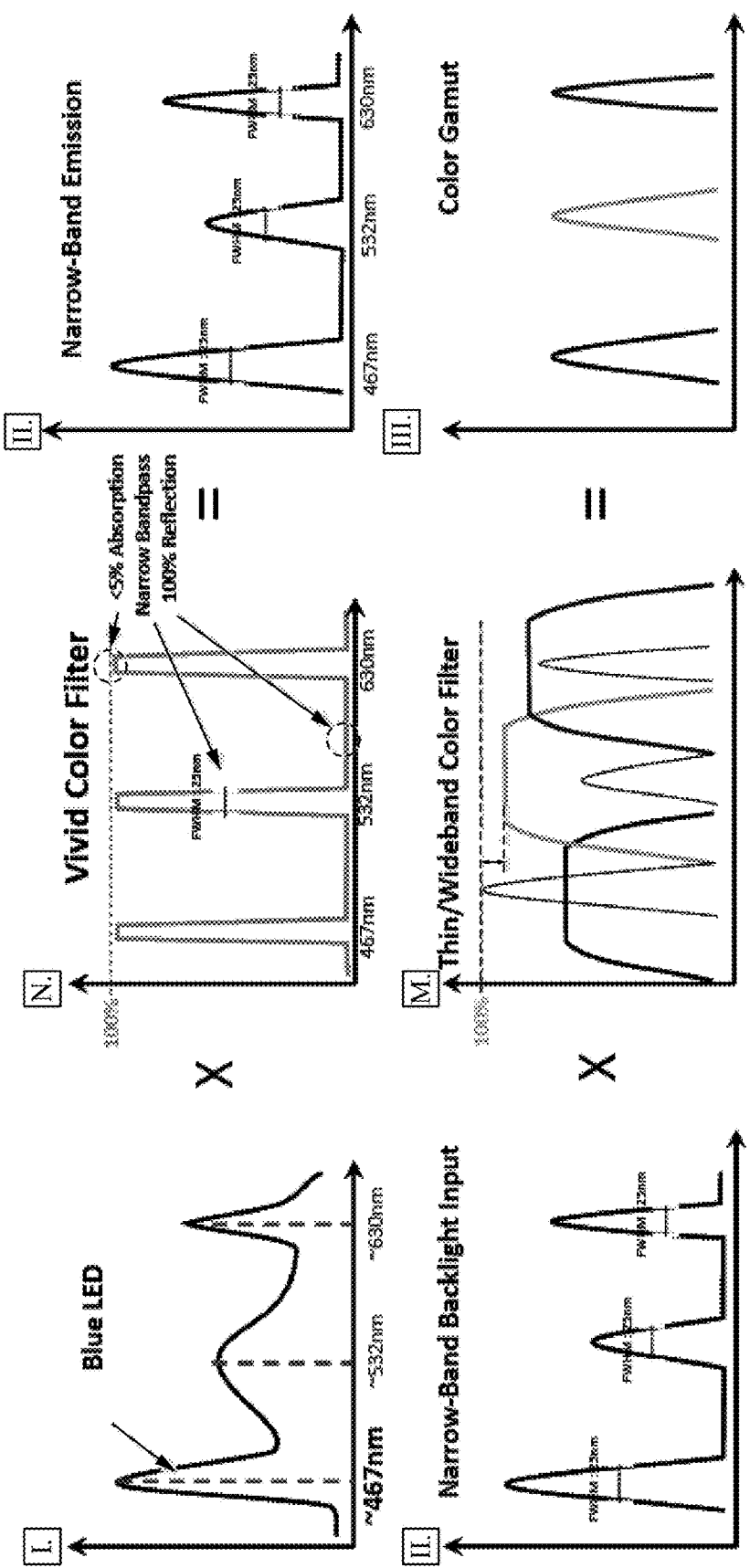
FIG. 3 is a diagram depicting formulation of red, green, and blue primary colors for a display from a white light source, reflective filter, and color filter in a backlight, according to an embodiment of the present disclosure.

Referring now to FIG. 3, an overview diagram depicts formulation of red, green, and blue primary colors with the use of a reflective multi-bandpass filter, according to an embodiment of the present disclosure. At the top left graph I depicts a spectrum of a white light source. The white light source can be a white LED, which can be formed with a blue light-emitting element and a fluorescent material used as the white light source. Or, an RGB-LED formed with blue, green and red light emitting elements can be used, or other white light sources known to one of skill in the art can be used. Moreover other embodiments can use a different set of three primary colors other than red, green, and blue (e.g. yellow, cyan, violet), and can use more than three primaries (e.g. at least three of a set of: red, yellow, green, cyan, blue and violet).

Graph N depicts the transmission characteristics of a multi-bandpass filter. According to embodiments of the present disclosure, the multi-bandpass filter is a reflective filter having high transmission (e.g., >75%, preferably >90% transmission) for passband wavelengths and strongly reflecting non-passband wavelengths (e.g. >90% rejection). The multi-bandpass filter can be, as a non-limiting example, a dichroic filter (e.g., a dichroic mirror). A dichroic filter can be deposited on a glass substrate, where the dichroic filter has a thickness of approximately 10-20 microns, and wherein the glass is approximately 100 microns in thickness. As depicted, the exemplary multi-bandpass filter includes three passbands, centered about red (640 nm), green (532 nm), and blue wavelengths (467 nm), respectively. Greater or fewer passbands are possible, as are other passband wavelengths. The width of the passband can be as narrow as 2 nm, or as wide as 35 nm based on the FWHM (Full-Width at Half-Maximum) measurement, for example. The characteristics of the filter bandpass being determined by designer as a trade-off for the cost, thickness of material deposition, number of deposition layers, and selection of the materials used for the deposition layers.

The effect of the multi-bandpass filter on the light source emission is to transmit wavelengths centered at the passbands, while strongly rejecting (reflecting) wavelengths not of the passbands. This results in the narrow multi-band spectrum shown in graph II, which has peaks at the center of the passbands (e.g., at 640, 532, and 467 nm). This spectrum represents the light passed through the multi-bandpass filter and into the backlight assembly. When modified by a set of color filters (shown in graph M), the narrow-band emission results in a spectrum as shown in graph III. Graph III represents the primary colors (e.g., red, green, and blue) that are produced by a display with a backlight according to embodiments of the present disclosure, a display possessing an ultra-wide color gamut.

The configuration and location of a multi-bandpass filter (e.g., a dichroic filter) within a backlight can take one of several alternatives. As is described further herein, a non-exhaustive listing of potential locations of the multi-bandpass filter includes: as an additional film (e.g., adjacent to uniformity film) between light source and light guide; as a standalone bar between light source and light guide; as an added layer with existing layers inside optical stack (e.g., adjacent to a polarizer of the LC polarizer stack); directly under or integrated with the color filter and before light passes through the filter, as one or more layers contained within a housing of the light source; and, directly on top of the surface of the light source within the housing (e.g. coating the junction material of an OLED).

According to embodiments of the present disclosure, a light source is able to include an arrangement (e.g., an adjacent film) for filtering illumination from the light source. Optionally, the adjacent film can include one or more components for recycling illumination of the light source, by which is meant translating illumination from outside a preferred spectral band or bands into the preferred band(s).

Figure 4:
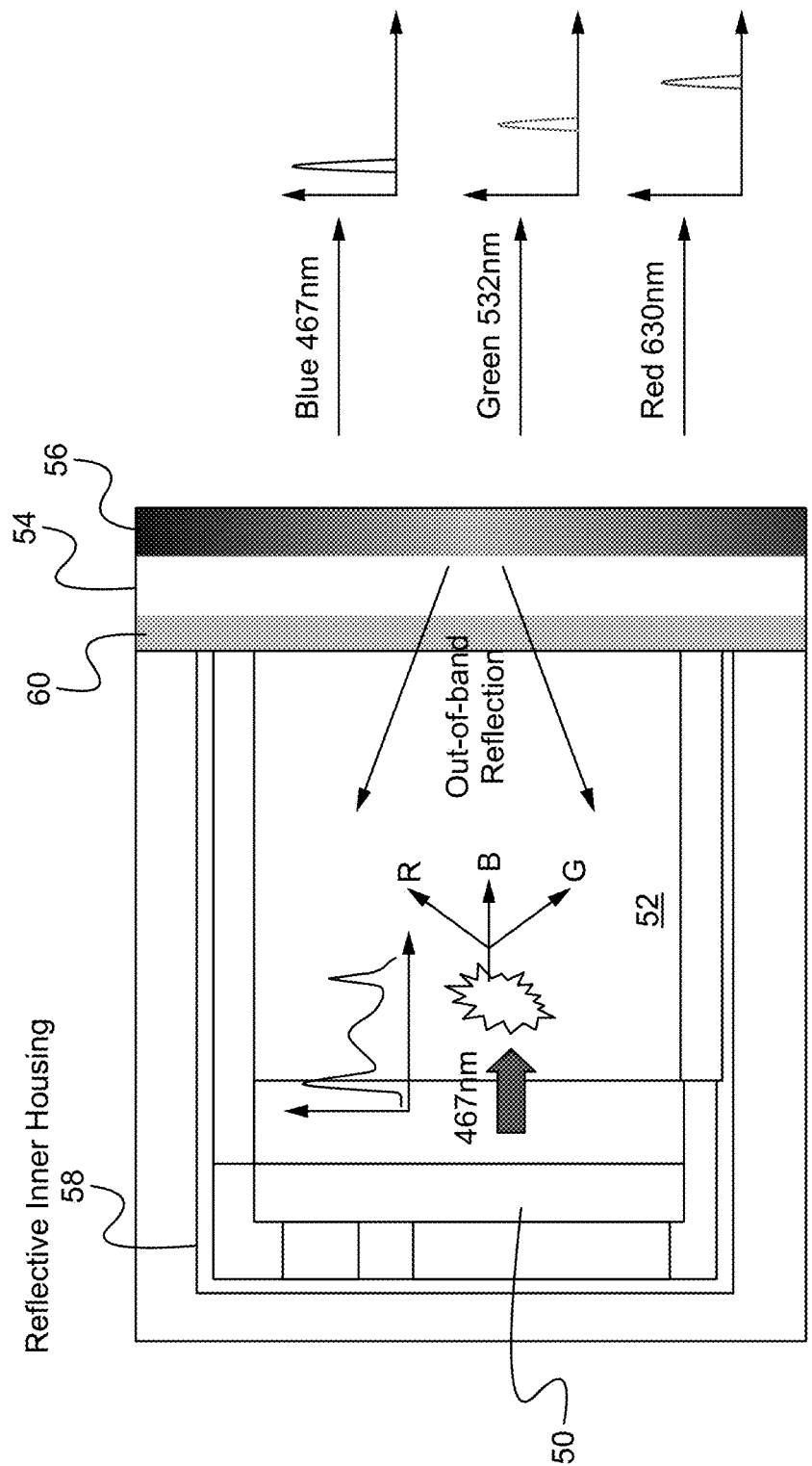
FIG. 4 is a schematic diagram depicting an exemplary light source including an adjacent filtering apparatus for outputting narrow band emission, according to an embodiment of the present disclosure

Referring now to FIG. 4, a schematic diagram depicts an exemplary light source 50 having an adjacent film (or bar) including a multi-bandpass filter 56. The light source 50 can be an LED, for example a white LED such as described above. The light source includes a photon pump, which in FIG. 4 is shown as emitting at a blue wavelength. For brevity the description of FIG. 4 proceeds in terms of a blue wavelength photon pump, but it will be appreciated that photon pumps having other emission wavelengths are possible, as are light sources that include photon pumps of more than one emission wavelength (for example, two or more photon pumps, e.g., a blue die junction and a green die junction). A particle 52 is contained within a housing of the light source 50, the particle 52 for converting blue photons from the blue photon pump into other wavelengths when excited, for example red and green wavelengths, which together can convey the desired mix of red, green and blue primary colors. There can be a combination of compounds present in particle 52, and the composition of the particles is designed to output selected wavelengths from the input of the emitted wavelength of light source 50. In the case of multiple photon pumps (e.g., two or more die junctions each emitting at a distinct wavelength) the combination of elements or compounds present in particle 52 can be provided in order to convert the combination of emitted wavelengths into a selected output. As an example, for a light source having green and blue photon pumps and a selected output of red, green, blue, cyan, and yellow (RGBCY), particle 52 is able to include elements or compounds that convert green wavelengths and blue wavelengths into red, cyan, and yellow wavelengths, thereby generating the selected RBGCY output. Further, particle 52 is optional, for example when a portion of the emitted wavelength of light source 50 is the preferred excitation wavelength.

According to embodiments of the present disclosure, the adjacent film includes a substrate 54 (e.g., a glass or plastic pane) positioned adjacent the LED, and the multi-bandpass filter 56 can be positioned adjacent the substrate 54. For example, the multi-bandpass filter 56 can be a dichroic filter, which can be deposited on the substrate 54. According to some embodiments the adjacent film includes a filter 60, which is a bandpass filter selected to pass portions of the light source wavelength and to reject other wavelengths. For example, filter 60 is a blue-pass filter for a blue wavelength light source, rejecting wavelengths longer than blue (e.g., to selectively pass light around 467 nm, with a width of 20 nm FWHM, require the filter to cutoff at 467+10=477 nm), followed by another filter deposition layer adapted to reject wavelengths shorter than blue (to selectively pass light around 467 nm, with a width of 20 nm FWHM, require the filter to cutoff at 467−10=457 nm). An exemplary use of filter 60 is as an IR mirror, whereby IR illumination is retained within the light source housing and heat transmission beyond the light source 50 is reduced. In some embodiments the filtering apparatus is utilized within a backlight that includes a number of discrete light sources, each disposed within a housing. In some embodiments a housing for the light source includes a reflective layer 58 (e.g., ESR), which serves to reflect illumination out of the housing.

In operation the light source 50 emits photons at a first wavelength (e.g., blue or ultraviolet), those photons being absorbed by the particle composition 52 and re-emitted at one or more longer wavelengths to form light emission peaks in the wavelength bands of the desired primary colors. The combined emission is incident on the multi-bandpass filter 56, which passes selected bands of wavelengths, and reflects out-of-band wavelengths. As shown in FIG. 4, the multi-bandpass filter 56 passes narrow band emissions centered on 467, 532, and 630 nm, corresponding to three primary colors (e.g., RGB) with a bandwidth less than 20 nm FWHM for each emission peak. In this manner more saturated, intense primary colors are propagated, for example to a backlight device (e.g., to the remainder of the backlight optical stack), and onto the illumination side of a display panel.

Recycled Illumination Via Up- and Down Conversion of Out-of-Band Wavelengths

The use of a highly reflective multi-bandpass filter, in contrast to an absorptive filter, means that energy of the light source illumination wavelengths not of the passbands (e.g., those not centered around red, green, and blue, for example) is not lost, but rather reflected back toward the light source. An opportunity therefore exists to capture some of this energy and to transform it into useful light, for example, to convert light source illumination outside of the passbands into one or more of the wavelengths transmitted by the multi-bandpass filter. Such a process is termed herein "recycling" or "recycled illumination," and can be effected via employing the Stokes shift, the anti-Stokes shift, and a combination of these, as described below. As is known in the art, the Stokes shift is a process wherein a material absorbs a photon of a first wavelength, some of the excitation energy is expended increasing the vibration of the particle molecules, and then at the lower quantum energy states the material re-emits a photon of a second wavelength, where the second wavelength is lower energy than the initial excitation energy and this greater than the first wavelength (that is, the emitted photon has undergone a red-shift to a longer wavelength). In contrast, the anti-Stokes shift is exhibited wherein a material absorbs two photons at a first wavelength, and emits one photon at a second wavelength that is less than the first wavelength (e.g., the emitted photon is more energetic than absorbed photon, on a per-photon basis).

One manner of performing this change is via the use of a phosphor or phosphors that exhibit the Stokes and/or anti-Stokes effect. Other means of changing, refining, eliminating, concentrating or tailoring the spectral band are also consistent with the spirit and scope of the present disclosure, and particle 52 can be one or more particles or compounds, including: compounds that exhibit effects such as quantum well excitron confinement (as used in Quantum Dots); phosphors exhibiting phosphorescence under excitation (and in some cases will continue to emit for milliseconds to hours after excitation has ceased); luminophores exhibiting luminescence, in particular photo-luminescent materials that absorb photons and re-emit at another wavelength while under excitation; fluorophores exhibiting fluorescence emission under excitation, usually from an electronic relaxation from a higher energy wavelength (typically shorter in duration than phosphorescence, lasting in the order of nanoseconds); and chromaphores, which absorb certain wavelengths while transmitting or reflecting other wavelengths. Materials that exhibit these characteristics are known to those of skill in the art, and the particular wavelengths absorbed and emitted can be selected based on selection of the material (or combinations of materials) used in the application herein referred to as particles.

According to embodiments of the present disclosure, materials that exhibit the Stokes effect, as well as or in addition to those that exhibit the anti-Stokes effect, can be used in combination with the reflected out-of-band wavelengths of the light source in order to recycle the illumination and capture more usable energy from the light source. In overview, a backlight operating in this manner includes a light source having illumination that is filtered by a reflective filter, and one or more materials that receive the reflected (that is, out-of-band) illumination and convert some of the reflected illumination into one or more wavelengths that are subsequently transmitted by the reflective filter—that is, converting out-of-band illumination into passband illumination. For example a phosphor that absorbs in a broad blue wavelength band and emits in green wavelength, can be adapted to recycle, absorb, and to be excited by reflected light not of the first desired narrow blue wavelength band, and to re-emit this energy around the desired green wavelength band. Similarly a particle adapted to absorb reflected light not used from the broad green wavelength band, and re-emit around a desired red wavelength, can be used to recycle reflected light not of the first blue narrow band, and not of the second green narrow band, and re-use such energy in the desired narrow red wavelength. It will be appreciated to those skilled in the art that this method is not restricted to just three primary narrow wavelength bands, but can recycle light for use by a plurality of primary bands, using a plurality of particles tailored for excitation by reflected light in any of the unused ranges, and re-emit in other desired wavelengths.

Additionally, in embodiments a particle that is excited by visible light, and has an emission range in the infrared and near-infrared spectrum can be adapted for excitation by any of un-recycled visible light, and emission into the infrared spectrum. For example a phosphor particle adapted for excitation by near-infrared and infrared, such as $Y_2O_2S$: Yb, Tm (excitation in 900~980 nm, emission in 460~480 blue), and phosphor such as $YF_3$: Er, Yb (excitation in 900~1000 nm, emission in 540~560 green), and phosphor such as YbOCl: Er (excitation in 900~980, emission in 640~680 red), will re-emit in desired visible wavelengths through Anti-Stokes effect.

Alternatively in other embodiments a luminophore that is excited by longer wavelengths (e.g. red to near infrared) visible light, and has an emission range in desired visible wavelengths through Anti-Stokes effect, can be adapted for excitation by any of un-recycled visible light, and emission into the desired visible wavelengths through Anti-Stokes effect.

According to an embodiment, recycling can include conversion of photon energy into electrical energy by a converting material (e.g., via a photovoltaic element). The converting material is able to be configured to absorb emission wavelengths not of the passbands (e.g., outside of a transmission multi-band)—for example, the converting material can absorb UV and/or IR wavelengths, and convert a least a portion of the absorbed wavelengths into electrical energy. It will be appreciated that this electrical energy harvesting can be accomplished using appropriate materials, and that particle 52 as described herein can include this functionality.

Figure 5:
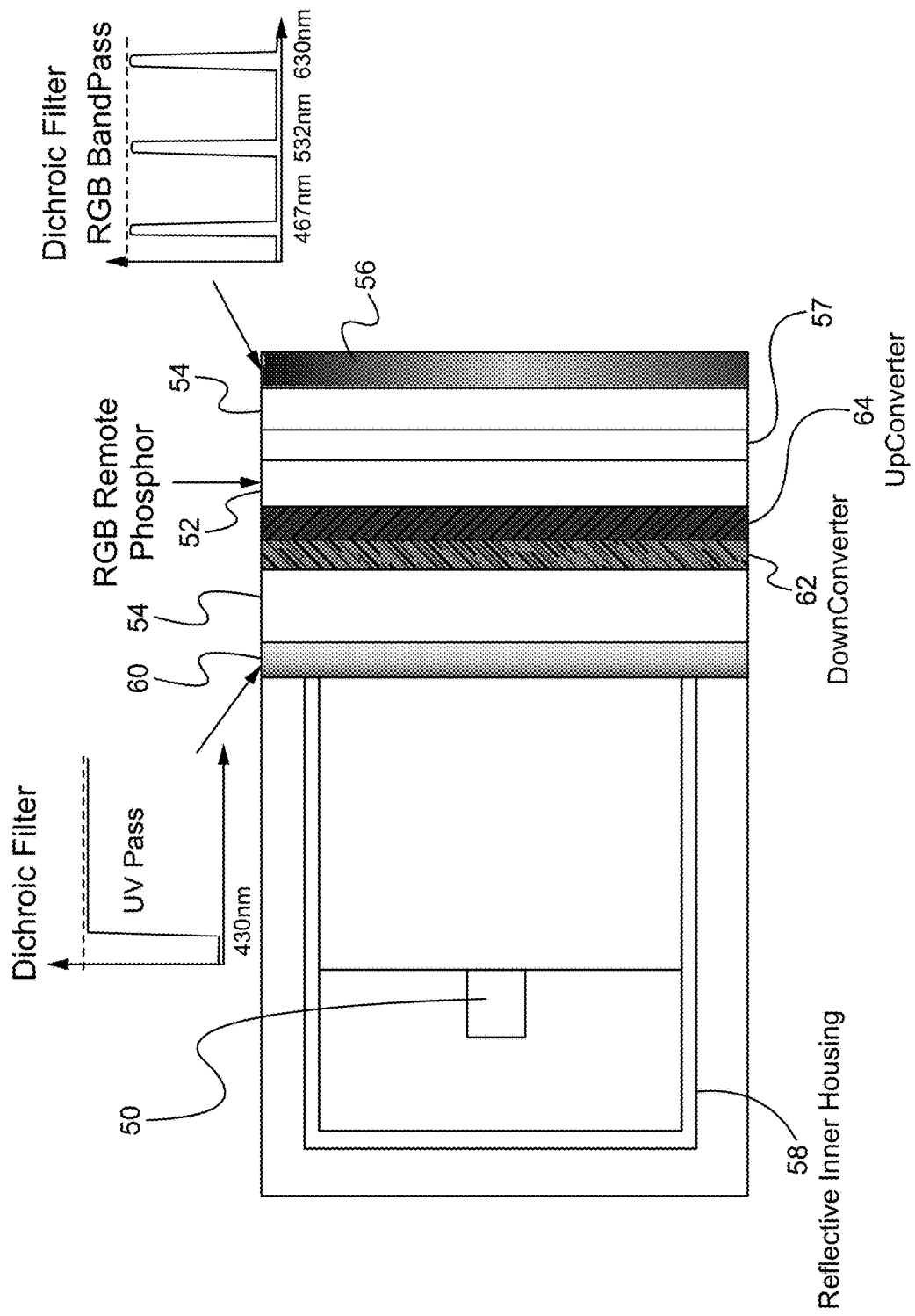
FIG. 5 is a schematic diagram depicting an exemplary light source including an arrangement (e.g., an adjacent film) for filtering and recycling illumination from the light source, according to an embodiment of the present disclosure.

Referring now to FIG. 5, an embodiment according to the present disclosure includes a light source 50 including an arrangement (e.g., an adjacent film) for filtering and recycling illumination from the light source a recycled illumination. Adjacent light source 50 are two substrate layers 54 and a particle 52. A reflective filter 56 is positioned at a distal side (with respect to the light source) of the outermost substrate 54. The reflective filter 56 can be, for example, a multi-bandpass filter of dichroic construction. The inner sides of the substrates 54 are coated with one or more materials that modify the wavelength of absorbed light (e.g., materials that exhibit the Stokes shift, the anti-Stokes shift, or a combination of these) to convert light from one wavelength into another. The inner side can also be coated with converting Chromaphore material to absorb photons of one wavelength and convert into re-emission in another wavelength. The inner side can also be coated with a photon absorbing material to convert light into electrical energy. As shown, the inner substrate 54 is coated with a first downconverting material 62 (e.g., a first particle composition), and the outer substrate 54 is coated with a second upconverting material 64 (e.g., a second particle composition). Materials 62 and 64 are able to be composed of similar materials as those described herein regarding particle 52. The light source 50 can be positioned in a housing, which can be coated with reflected coating 58. As shown, particle 52 is present as a coating on substrate 54, that is, remote from the light source 50. Alternatively, particle 52 can be present within the light source 50 housing, as is known in the art and shown and described regarding FIG. 4.

In operation, illumination emitted from the light source is transmitted through the substrates 54 and conversion materials 62 and 64, and is incident upon reflective filter 56. Reflective filter 56 passes wavelengths of the one or more passbands, and reflects other wavelengths. The passed wavelengths of filter 56 can be used as the primary colors of a display, for example (e.g., edge-lit, backlit, or front-lit display), or as the final apparent color of an illumination source (e.g., an office lamp or a street lamp). The reflected wavelengths are directed back toward the substrates 54 and conversion materials 62 and 64. If conversion materials are selected for the Stokes effect, some of the reflected illumination will be absorbed and re-emitted at a longer wavelength (e.g., UV absorbed and emitted in the visible spectrum). If conversion materials are selected for the anti-Stokes effect, some of the reflected illumination will be absorbed and re-emitted at a shorter wavelength (e.g., IR absorbed and re-emitted in the visible spectrum). The particular conversion materials used can be selected based upon the light source spectrum, the passbands of the reflective filter 56, and the desired recycled illumination characteristics.

The configuration shown in FIG. 5 can include a reflective filter 60. The reflective filter 60 can be immediately adjacent the light source, and can serve as a first filter for light source illumination, as well as a mirror for selected wavelengths of reflected illumination from reflective filter 56. Reflective filter 60 can be a passband filter, for example passing all wavelengths shorter than UV (e.g., rejecting longer than UV wavelengths). In this manner all wavelengths shorter than UV are propagated to the reflective filter 56, and any re-emitted wavelengths of greater wavelength (emitted from conversion material 62 and/or 64) will be reflected within the space between reflective filter 56 and reflective filter 60. In this manner a recirculation chamber is formed, defined by the space between the reflective filters 56 and 60 and including conversion materials 62 and 64. Rejecting longer-than UV wavelengths leads to limiting or removing IR wavelengths from the light source and can reduce the amount of heat buildup in the display, while at the same time making the other wavelengths available for reflection by the reflective filter 56. In another embodiment, light source 50 is of a blue wavelength and filter 60 acts as a notch passband, rejecting visible and invisible light other than blue including both UV and IR wavelengths. The described passband and rejection wavelengths are merely exemplary, and any particular passband and rejection wavelengths can be selected based on the desired wavelengths ultimately to be transmitted to illuminate a display.

According to embodiments of the present disclosure, conversion material 62 operates to convert reflected illumination into IR wavelengths, which in turn are reflected by both reflective filters 56 and 60. Conversion material 64 operates to convert IR wavelengths into one or more of the passband wavelengths, which are transmitted through the reflective filter 56. In an embodiment, the re-emission wavelength of conversion material 64 corresponds with the least intense primary natively produced by the light source (e.g., the red portion of the spectrum as shown in FIG. 3). In this manner portions of the light source spectrum having lower intensity can be bolstered by the recycled illumination, thereby developing a spectrum of more uniform intensity. A greater number of conversion materials can be present, each of which can serve to convert IR wavelengths into a selected passband wavelength (e.g., one of red, green, and blue).

Alternatively, the direction of wavelength conversion can be opposite—that is, a conversion material can convert reflected illumination into UV wavelengths, which can be reflected by reflective filters 56 and 60, and another conversion material can convert UV wavelengths into one or more of the passband wavelengths. An advantage of down-coversion is a higher efficiency of the Stokes shift, as compared with the anti-Stokes shift which is minimally half the efficiency of the former, requiring two photons to produce one, but in contemporary phosphors is typically on the order of sub-10% efficiency.

While FIGS. 4 and 5 illustrate both elements 62 and 64 for downcoverting and upconverting emission wavelengths from light source 50, it should be appreciated that in some embodiments only one conversion direction is enabled, by the presence of downcoverstion particles 62 only (or alternatively, upconversion particles 64 only). Multiple converted wavelengths can be produced from the light source 50 with the use of multiple converting layers of the same type, e.g., downconverting layers 62. According to embodiments of the present disclosure, conversion of light source 50 emission wavelength(s) to wavelengths of the one or more passbands is effected by cascading conversion particles—that is, a series of particles 52, each absorbing and emitting at distinct wavelengths, can work in conjunction with the light source 50 and the reflective filter 56 to convert light source 50 wavelength(s) into the selected wavelengths of the passbands. This is possible without use of the anti-Stokes effect, by simply recycling light source 50 illumination through a cascaded series of particles, organized with overlapping excitation and emission ranges (or other combinations of conversion, absorption, or reflection materials).

For example, an embodiment similar to those depicted in FIGS. 4 and 5—but without the upconverter element 64—can include light source 50 as a 360-400 nm near-UV Photon Pump, with illumination incident upon a first filter 60 (e.g., a dichroic UV band-pass, where all other wavelengths are reflected). A first conversion material 62 (e.g., a first downconverting phosphor) is excited by UV wavelengths, and emits blue wavelengths. This blue light is incident upon the multi-bandpass filter 56 (e.g., a dichroic filter), for example corresponding to passbands of blue 467 nm, green 532 nm, red 630 nm, having +/−20 nm FWHM narrow bandpass. Reflected blue light not of 467+/−20 nm is incident upon a second conversion material 62 (e.g., a second downconverting phosphor) that is excited by UV/blue wavelengths, and has green emission. This emitted green light is incident upon the multi-bandpass filter 56, and reflected green light not of 532+/−20 nm (as well as the blue light not of 467+/−20 nm) is incident upon a third conversion material 62 (e.g., a third downconverting phosphor) that is excited by UV/blue/green wavelengths, and has red emission). The red illumination is incident on the multi-bandpass filter 56.

The red illumination can be further modified according to the following. Reflected red light not of 630+/−20 nm can be incident upon a fourth conversion material 62 (e.g., a fourth downconverting phosphor) that is excited by red/green wavelengths, and emits in the IR. The IR emission is then incident upon the multi-bandpass filter 56. In some embodiments, the multi-bandpass filter 56 is tailored to pass the emitted unrecycled waste light out, for example as invisible infrared, and in a range that produces little heat, such that this light is not recycled by the assembly.

Alternatively, the reflected red light not of 630+/−20 nm can be incident upon a fourth conversion material (e.g., a fourth phosphor) that is excited by red/green wavelengths, and emits in the IR, and the assembly further includes an optional photovoltaic element (e.g., 57) adapted to absorb IR radiation and to generate electrical power.

While the above describes a UV light source 50 embodiment, a similar approach can be implemented using a blue light source 50 (or indeed other light source 50 wavelengths). The conversion material(s) 52, the first filter 60 and the multi-bandpass filter 56 can be tailored to recycle illumination outside of the passbands. One reason that a blue light source can be preferable is that blue light sources produce more photon's per watt than do UV light sources. Additionally, contemporary phosphors for conversion from blue wavelengths are better understood. UV light sources can be preferable to Blue light sources in view of the fact that contemporary blue light sources tend to have a wider emission bandwidth, and also blue light source performance can vary based on temp and voltage. An embodiment of a backlight according to the present disclosure includes an arrangement of reflective filters and recycling elements that avoids degrading input light of the light source. Degradation can occur because the recycling element (e.g., phosphors) not only recycle reflected light, but can also absorb some of the desired light that is incident by the light source. Therefore, a configuration of the present disclosure includes placing the recycling element out of the transmission light path, generating a recirculating light path circuit.

Figure 6A:
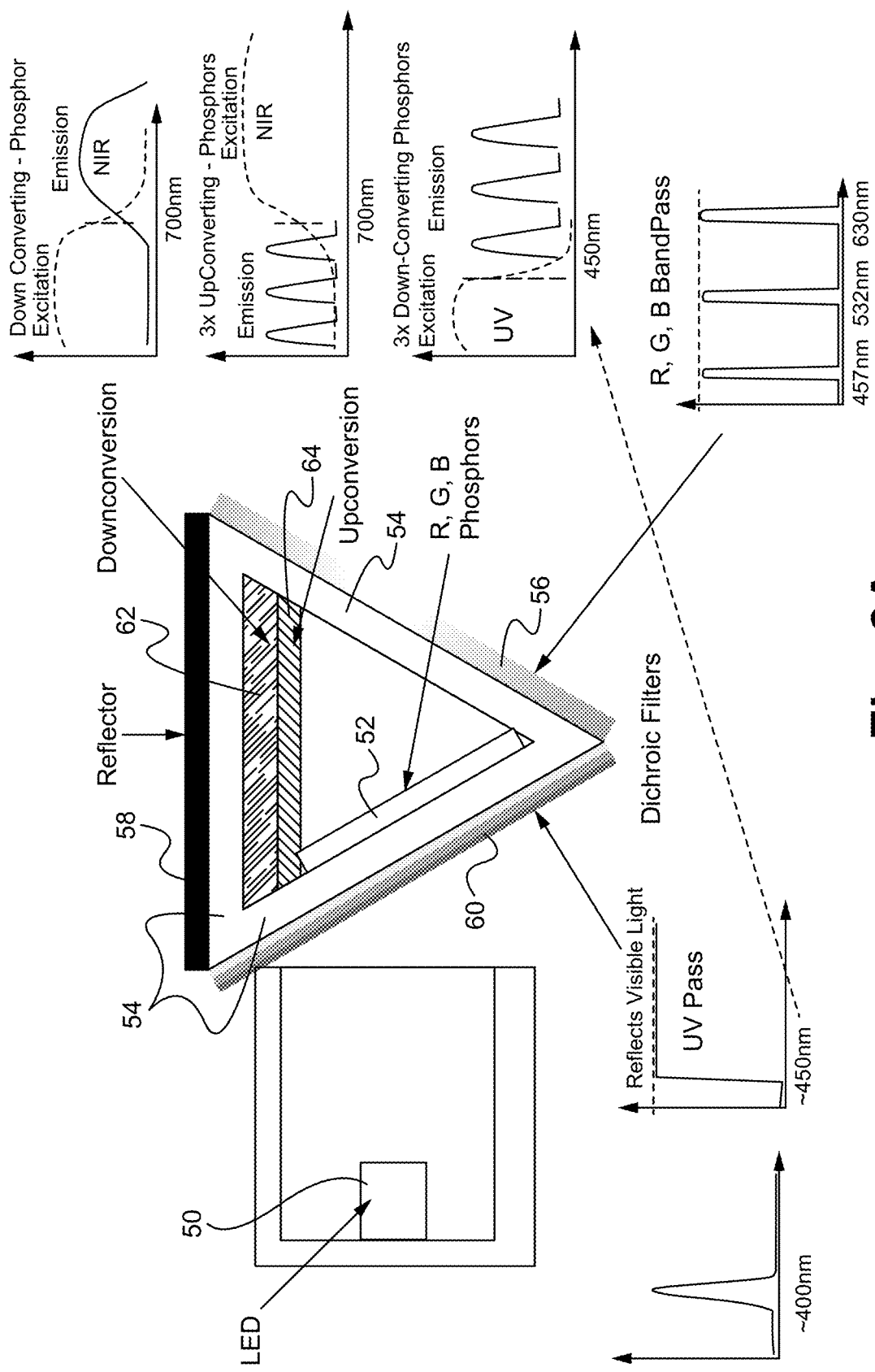
FIGS. 6A-6F are schematic diagrams depicting an exemplary light source including an adjacent arrangement (e.g., a standalone bar) for filtering and recycling illumination from the light source, the recycling occurring along a light path different from that of transmission for illumination, according to embodiments of the present disclosure.

Referring now to FIG. 6A, a recycling element is placed adjacent a light source 50. The light source optionally includes a reflective surface 58 (not shown). A first reflective filter 56, a second reflective filter 60, remote conversion particles 52 and conversion materials (e.g., phosphors) 62 and 64 are all disposed on substrates 54 (e.g., glass substrates), which are arranged in a triangular shape. The triangular arrangement forms light paths such that up- and down-conversion of illumination does not occur along a transmission light path (e.g., light path to a display). While the arrangement shown is triangular, other arrangements that place the up- and down-conversion of reflected illumination out of the transmission path are also possible. One or more of the substrates 54 can include a reflecting material 58.

Figure 6B:
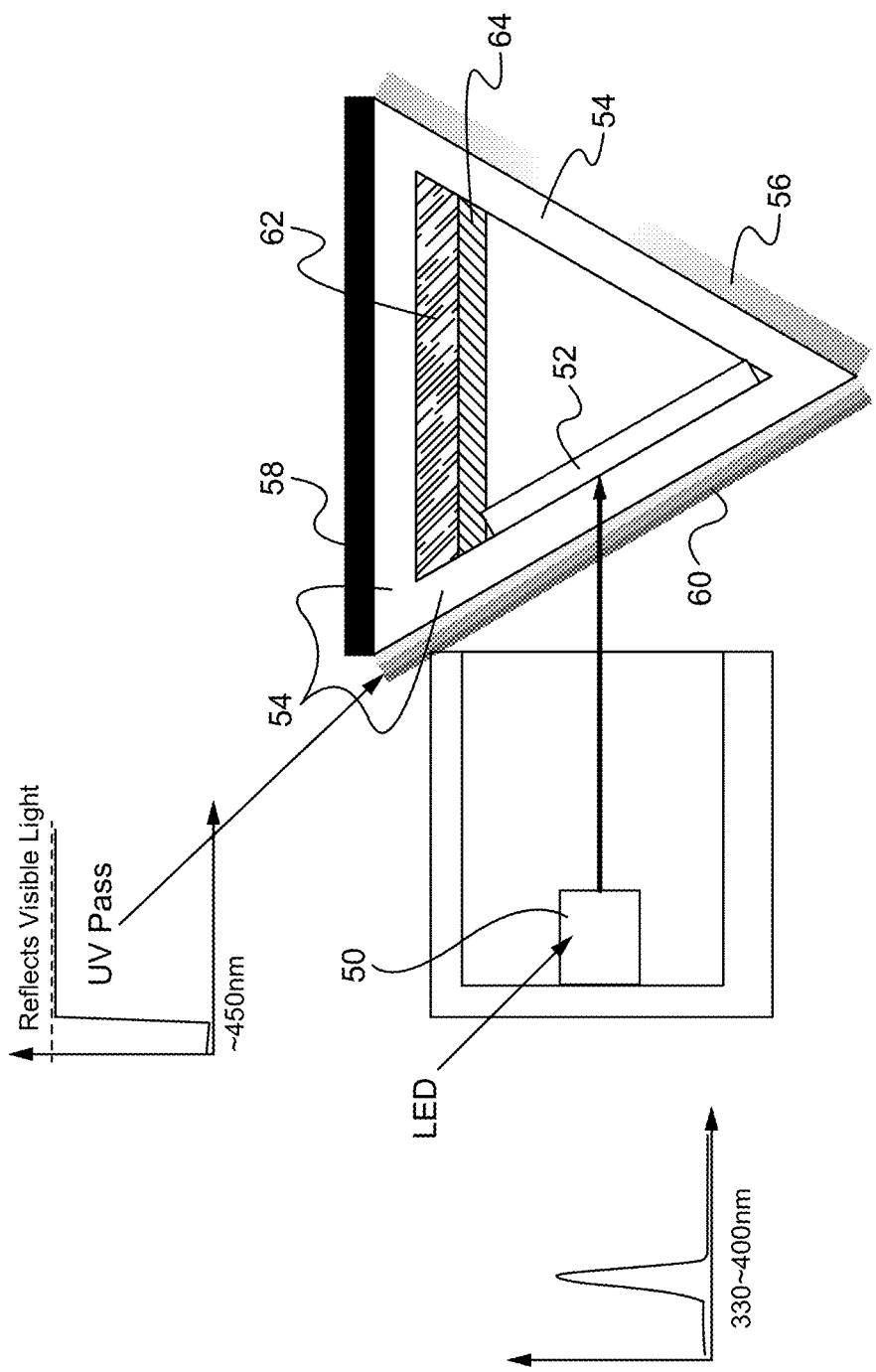
Figure 6C:
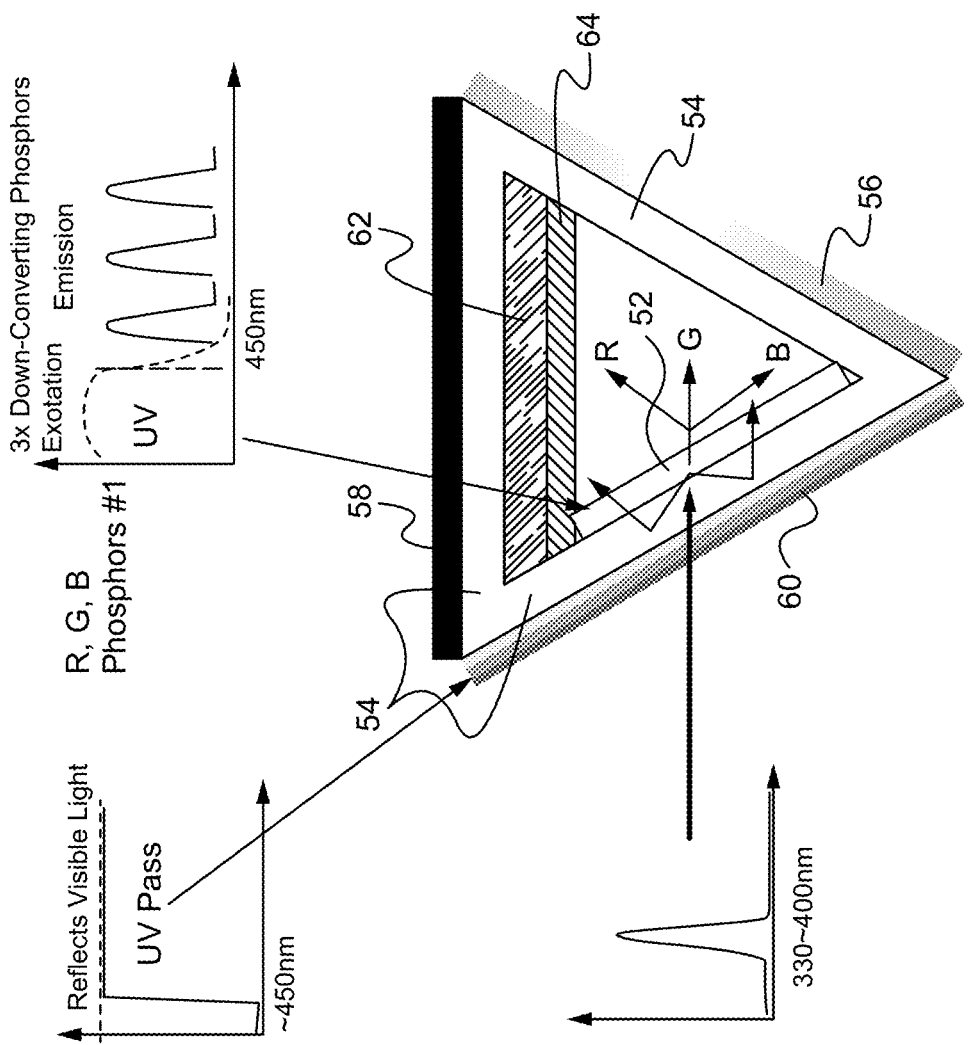
Figure 6D:
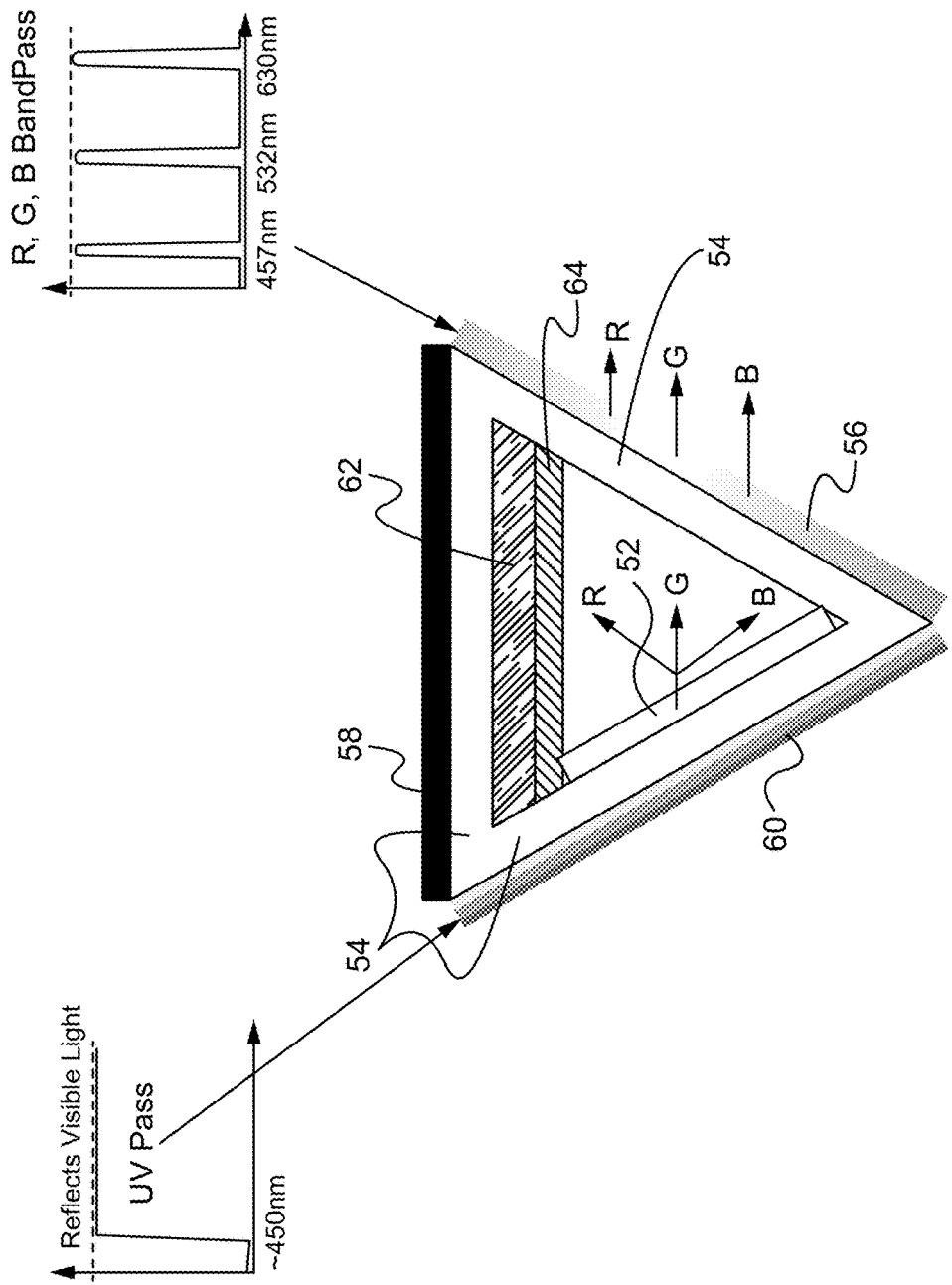
Figure 6E:
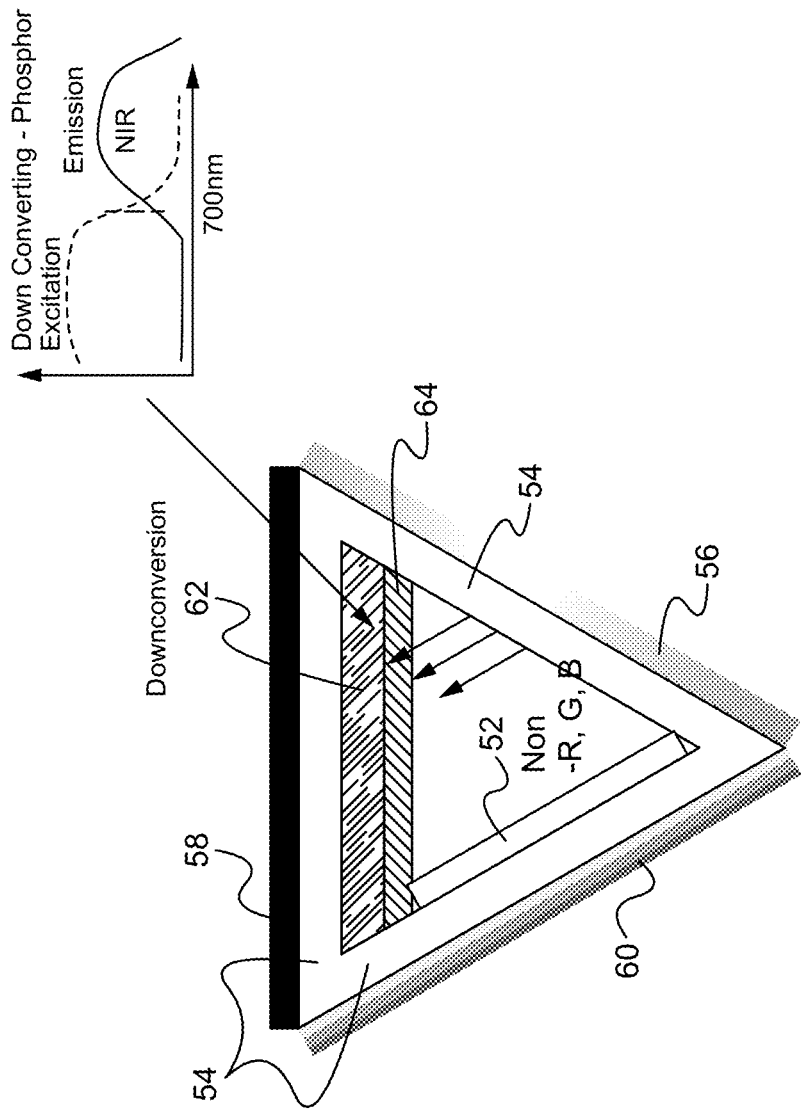
Figure 6F:
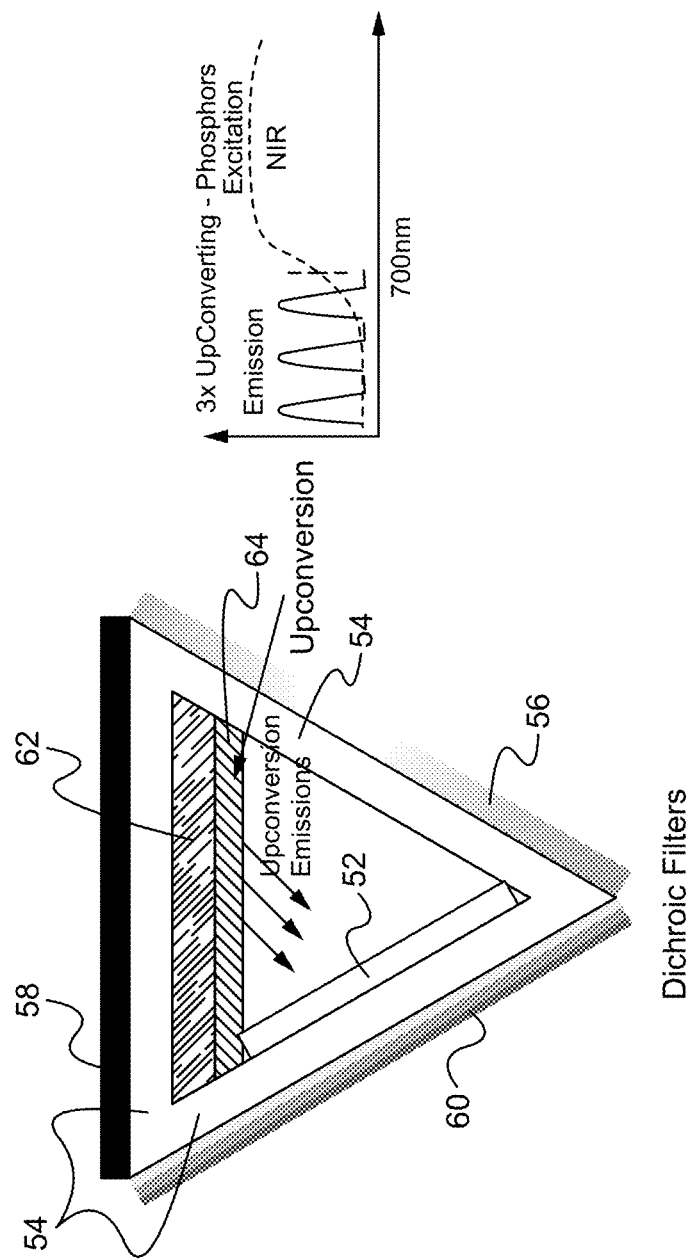

In operation, as shown in FIG. 6B, illumination from the light source 50 is incident upon the second reflective filter 60, which passes wavelengths within a passband and reflects other wavelengths. As shown in FIGS. 6C and 6D, the transmitted wavelengths are incident upon the remote particles 52, which convert incident illumination to the desired primary wavelengths (e.g. at least three of a set of red, yellow, green, cyan, blue and violet wavelengths). The primaries propagate to the first reflective filter 56, which passes wavelengths of the passband of reflective filter 56 (e.g., a multi-band corresponding to narrowband primary wavelengths), and reflects other wavelengths. As shown in FIGS. 6E and 6F, reflected wavelengths from the reflective filter 56 are directed toward a recycling element including conversion materials 62 and 64, which function to up- and down-convert some of the reflected illumination into the passband of the reflective filter 56. This recycled illumination is then reflected from reflective filter 60, and the wavelengths within the passband of reflective filter 56 are transmitted on through the backlight. In general, the proportion of particles within the recycling element (e.g., proportion of conversion materials 62 and 64) is tailored along with the light source emission spectrum, such that the finally transmitted wavelengths have the desired proportions of primaries.

Figure 7A:
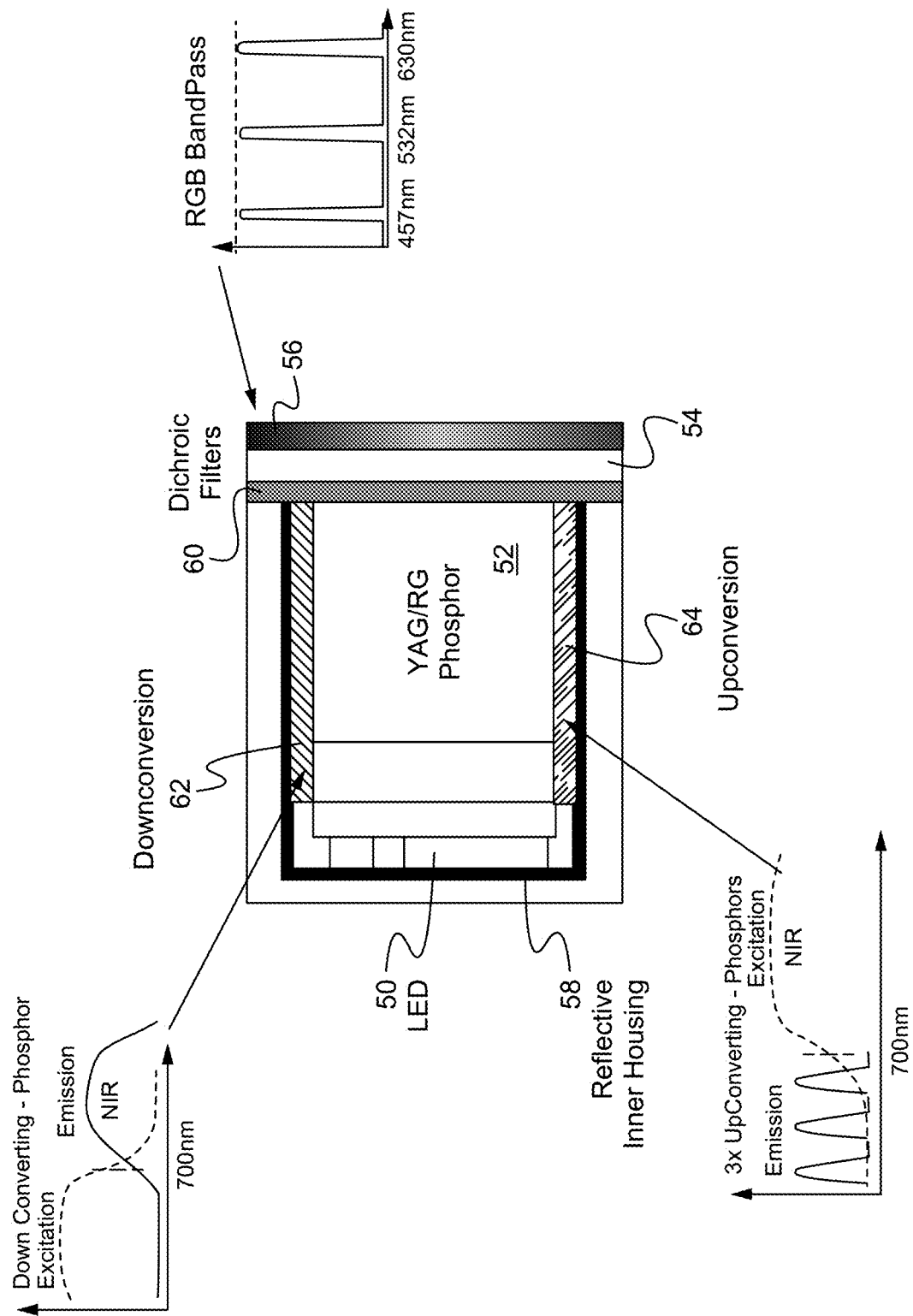
FIGS. 7A-7F are schematic diagrams depicting an exemplary light source including a film having an adjacent reflective filter and one or more recycling layers contained within a housing of the light source according to embodiments of the present disclosure.
Figure 7B:
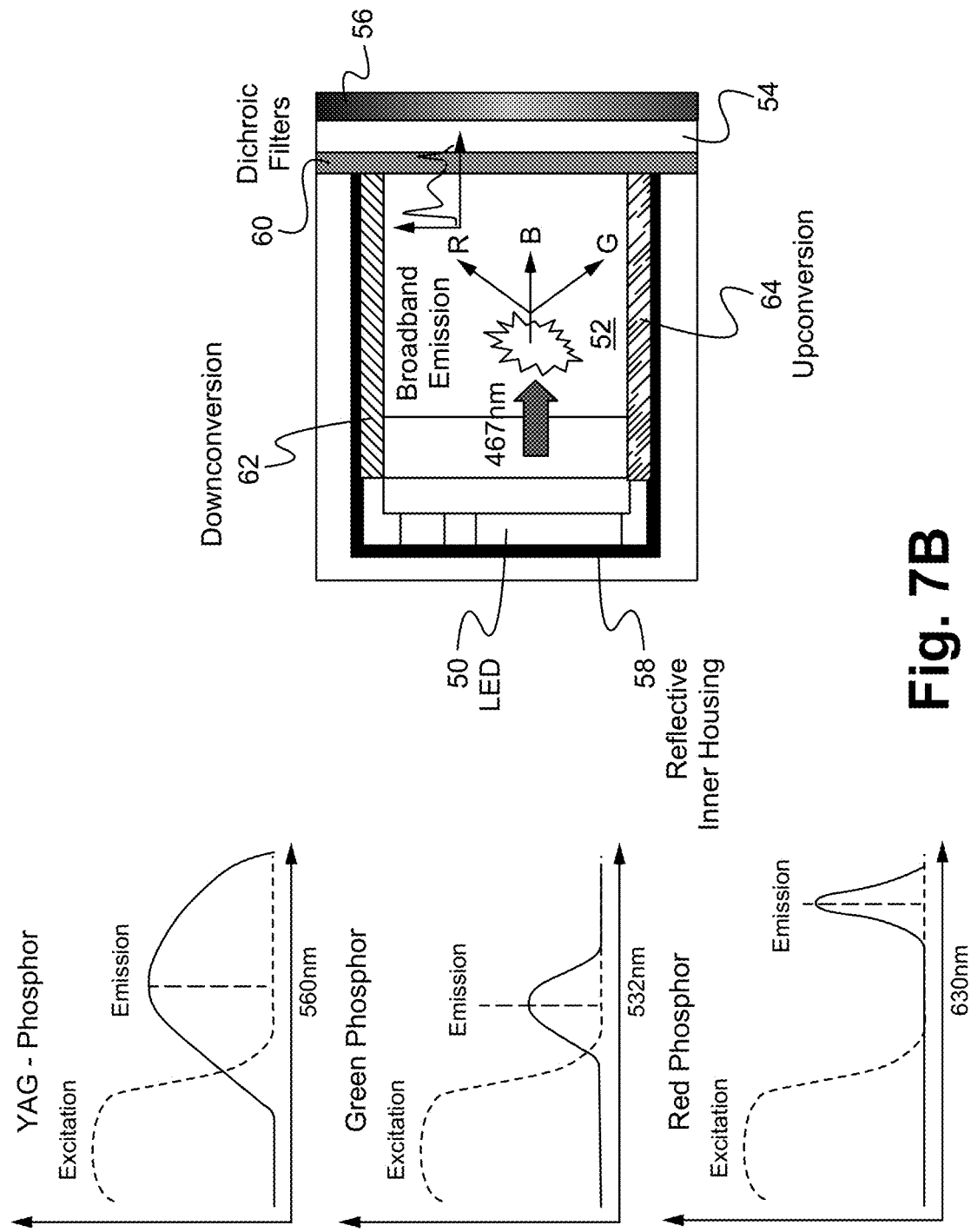
Figure 7C:
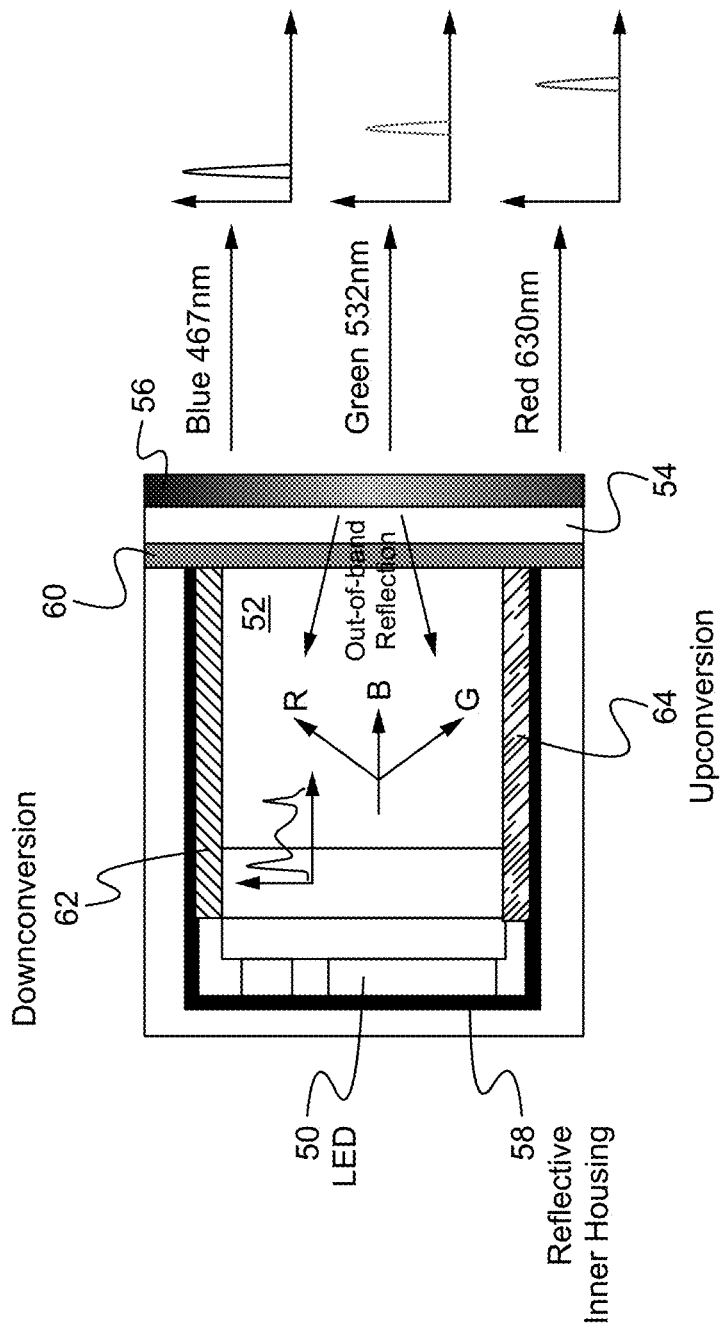
Figure 7D:
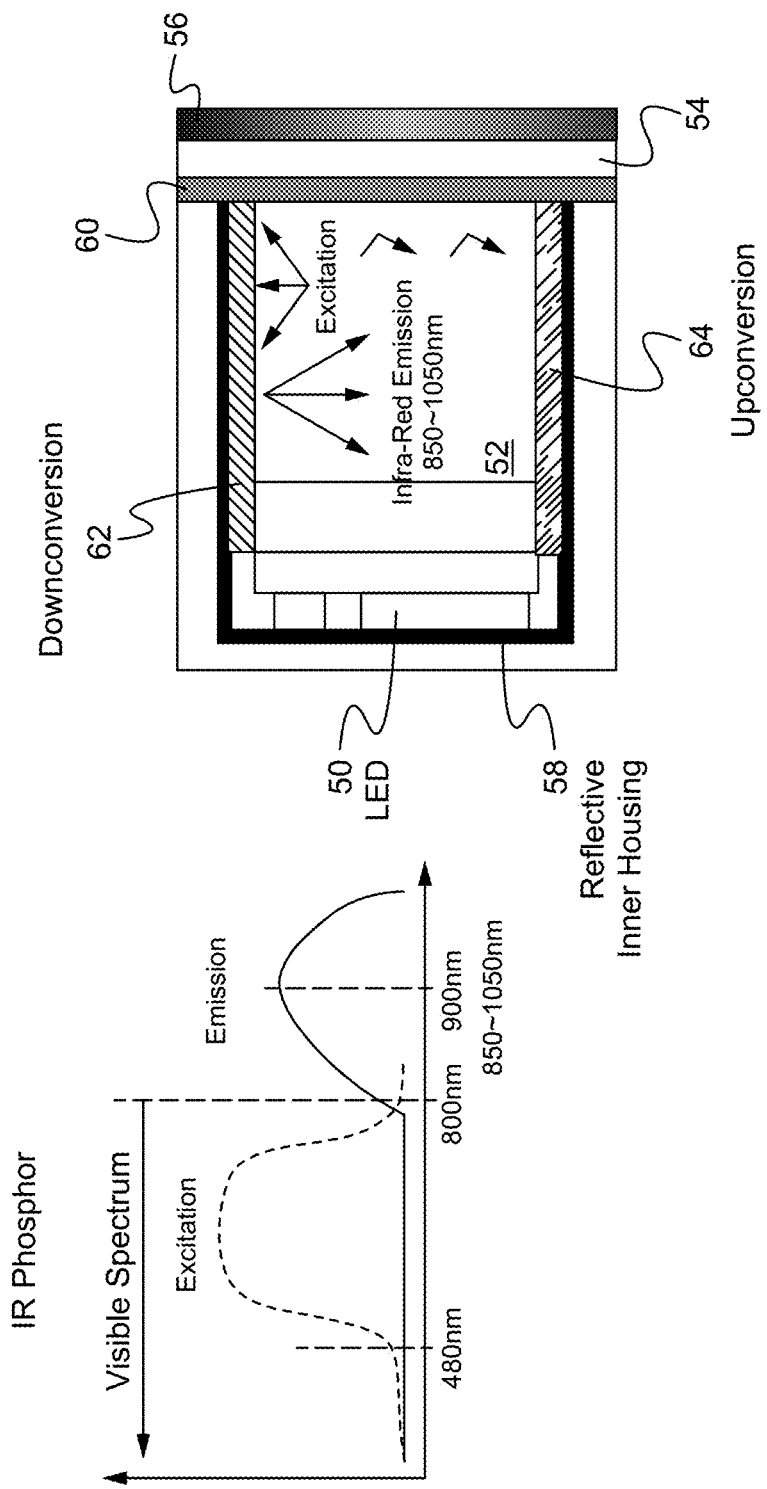
Figure 7E:
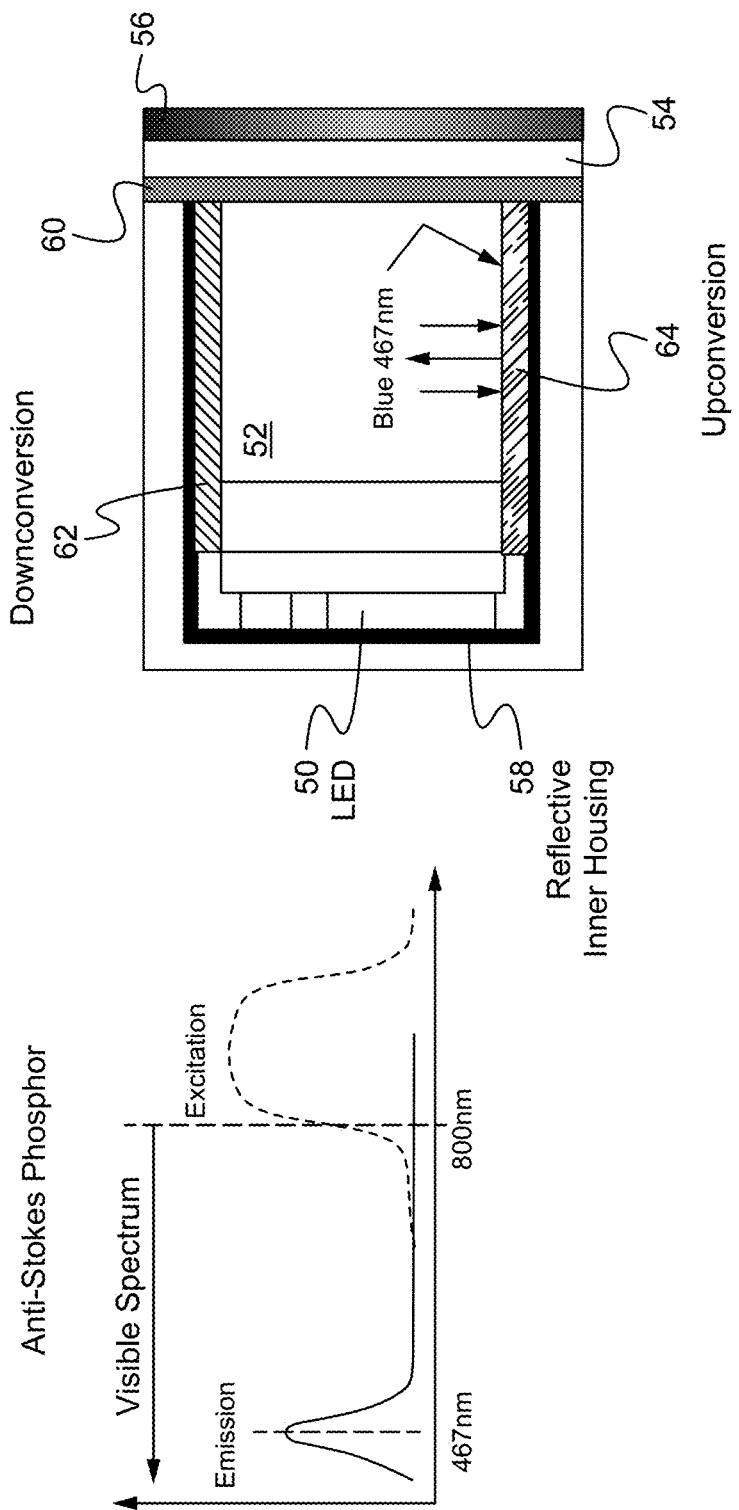
Figure 7F:
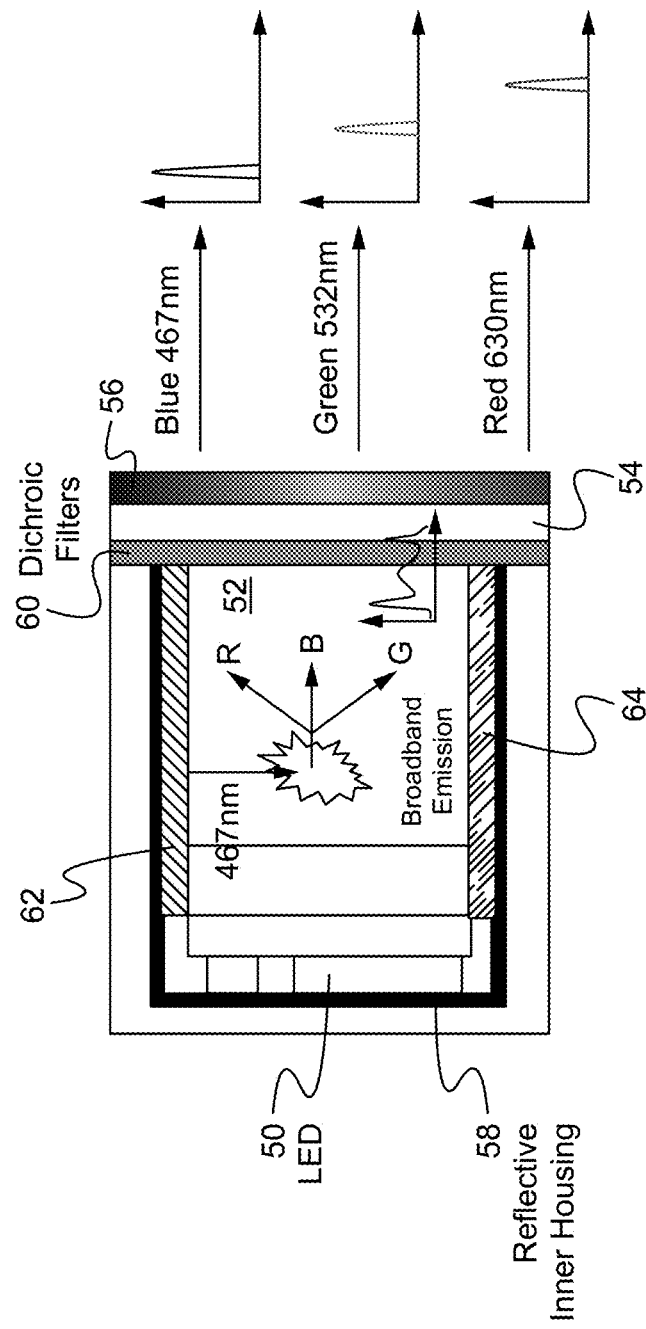

Recycled illumination conversion materials 62 and 64 are also able to be located within the housing of a light source (e.g., within a modified LED housing). FIGS. 7A-7F depict a light source having recycling elements within a light source housing, according to embodiments of the present disclosure. Referring now to FIG. 7A, a light source 50 is located in a housing that includes particle 52 for converting light source 50 emission into broad spectrum emissions (e.g., from blue wavelengths into red and green). The housing further includes down- and up-conversion materials 62 and 64 (e.g., phosphors exhibiting Stokes and anti-Stokes effects). Reflective multi-band filter 56 (and optionally, bandpass filter 60) is located adjacent the light source, for example on a substrate film or bar 54. In operation, as shown in FIG. 7B, particle 52 absorbs light source 50 emission and generates at least one spectrum emission from absorbed radiation. As shown in FIG. 7C, the emissions are propagated to the multi-bandpass filter 56, which transmits narrow primary passbands (e.g., 467, 532, and 630 nm) while reflecting out-of-band wavelengths within the housing. As shown the apparatus includes bandpass filter 60, which serves to pass wavelengths shorter than IR (e.g., functions as an IR mirror), however the presence of filter 60 is optional. FIG. 7D depicts the absorption and excitation by visible wavelengths of the down-conversion material 62, which re-emits radiation in the IR spectrum. The re-emitted IR propagates throughout the housing of the light source 50, with reflective surface 58 and filter 60 aiding in containing the IR radiation within the housing. FIG. 7E depicts the absorption and excitation by IR wavelengths of the up-conversion material 64, which re-emits radiation in the visible spectrum (e.g., 467 nm). As shown in FIG. 7F, the re-emitted visible wavelengths propagate throughout the housing of the light source 50, causing absorption and broadband re-emission by particle 52. This broadband emission is filtered by multi-bandpass filter 56 to generate narrow band emissions, and the cycle continues to repeat.

Figure 8:
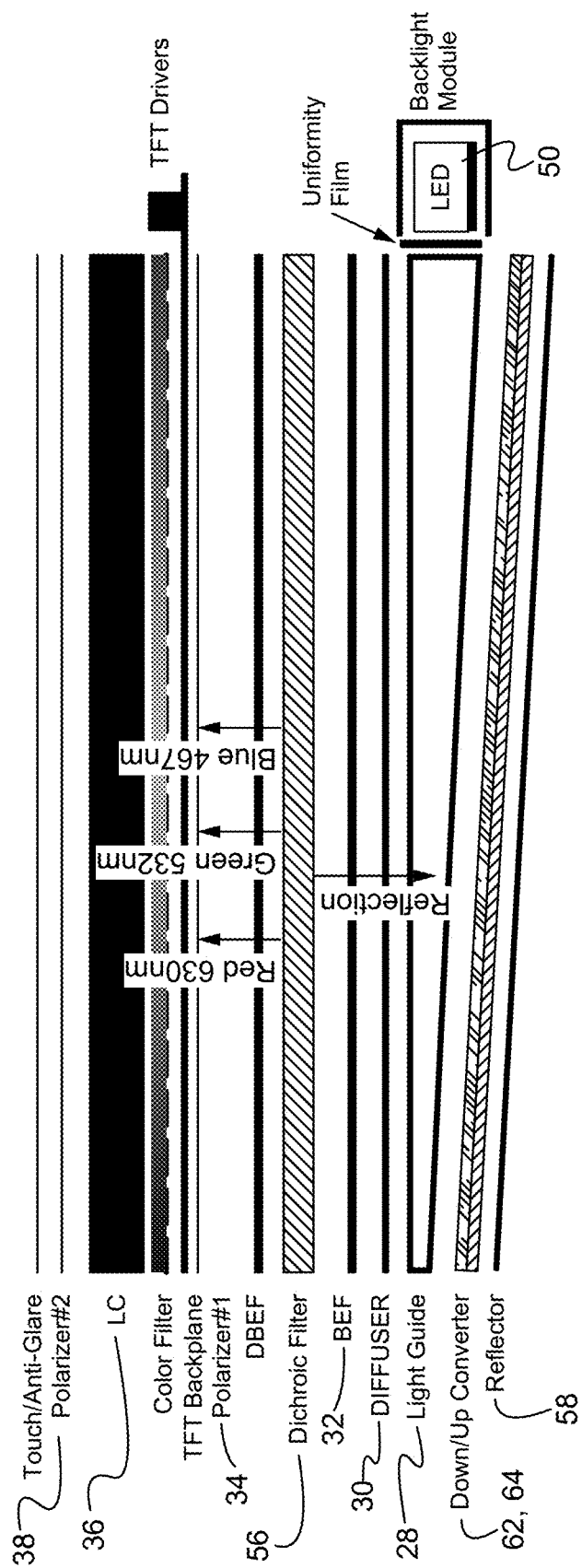
FIG. 8 is a schematic diagram depicting an exemplary light source in cross-section having a reflective filter as an added layer with existing layers inside optical stack (e.g., adjacent to a polarizer of the LC polarizer stack) according to an embodiment of the present disclosure.

As has been described in several aforementioned embodiments, both reflective filters and recycling elements can be located at various positions within an illumination system, for example a backlight of a display. Referring now to FIG. 8, an embodiment including multi-bandpass filtering and recycling layers positioned within the optical stack of a backlight is depicted. As shown, a light source 50 is adjacent a light guide, having a uniformity film placed therebetween. Adjacent the light guide toward a reflector (e.g., ESR reflector) is a film layer containing down- and up-conversion materials 62 and 64. These materials can be, for example, deposited on a glass or plastic pane of the optical stack. In a direction toward the LC stack of the backlight is a layer containing the multi-bandpass filter 56 (e.g., narrow emission bandpass of red, green, and blue wavelengths). In operation, broadband light emitted from light source 50 propagates through the uniformity film and into the light guide, from which it is substantially evenly distributed across the surface of the optical stack. The broadband illumination incident upon filter 56 is filtered such that the narrow band emissions are passed, while other wavelengths are reflected backward. These reflected wavelengths, upon incidence at conversion materials 62 and 64, are up- and down-converted to be re-emitted in desired primary color emission wavelength bands, as has been described herein. These re-emitted primary emissions are reflected back toward the second filter 56, which passes the accepted narrow band primary emissions and reflects out-of-band wavelengths, and the cycle repeats. In this manner both the narrow band filter, and the recycling of unused wavelengths from the light source 50, occur with the optical stack of the system (e.g., the backlight of a display).

In an embodiment a photovoltaic layer (not shown) is introduced into the recycling element, such that unused light energy reflected from the primary emissions bandpass filter can be converted to electrical energy, which can be otherwise reused within the system. The reflected wavelengths can be absorbed by photovoltaic layers and converted to electrical energy, which is recycled within the electrical system, for example to assist driving the backlight.

Figure 9:
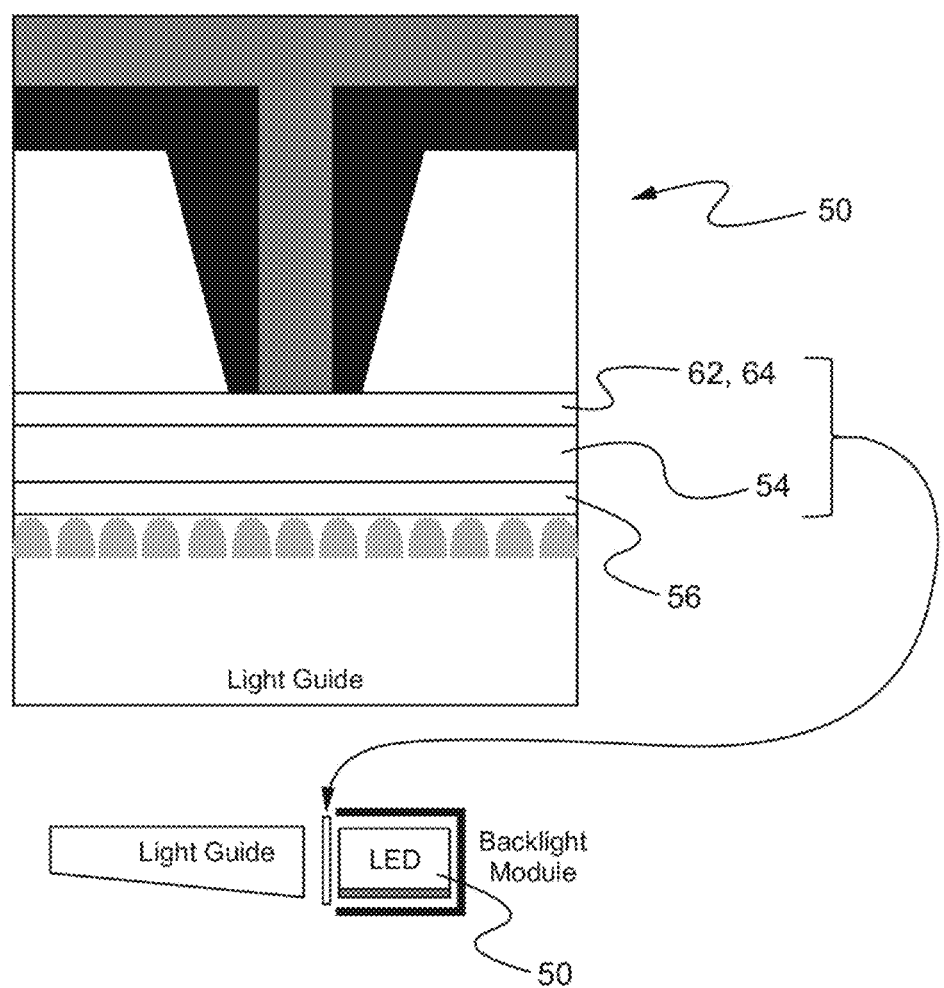
FIG. 9 is a schematic diagram depicting an exemplary light source including an adjacent film for filtering and recycling illumination from the light source according to an embodiment of the present disclosure.

Alternatively, the narrow band filtering and the recycling of unused wavelengths from the light source can be made to occur adjacent to the light source, prior to propagation of light to a light guide. Referring now to FIG. 9, an embodiment of the present disclosure includes a film layer including filtering and recycling elements positioned adjacent to a light source. The film layer can include a glass substrate 54, having conversion materials 62 and 64 deposited on a first side of the substrate 54, and multi-bandpass filter 56 deposited on a second side. According to an embodiment, the substrate 54 is positioned immediately adjacent an output surface of light source 50. The film layer can be used in combination with a conventional uniformity film, which serves to more evenly distribute illumination at the interface from light source to a light guide. The light source 50 can be a broad spectrum light source, or a narrow spectrum. If light source 50 is a narrow spectrum light source and broad spectrum illumination is preferred, a layer of particle 52 can be included with conversion materials 62 and 64. The conversion materials 62 and 64 and filter 56 operate in the manner described in the several embodiments herein to pass narrow band emissions according to the passbands of filter 56, and to recycle other wavelengths.

Alternatively in an embodiment the final LCD color filter elements can themselves utilize a dichroic reflective filter. Rather than absorption filter elements for typical color filtering of the primary color sub-pixel elements (e.g. red, green, blue), a novel color filter using reflective dichroic filter will reflect light not of the desired primary color narrow wavebands, back through the LC element into the optical stack. This can have the advantage of reducing the display thickness by integrating dichroic coating layers.

In some OLED display embodiments, the pixels consist of point light sources generated by OLED, with one emitting sub-pixel in each primary color (e.g. red, green, blue) and in some embodiments also including white, forming a matrix of RGBW pixels. Alternatively, in other OLED display embodiments, the sub-pixels are broad-spectrum white point sources, with a color filter placed over each white sub-pixel to create the desired RGBW wavelength bandpass for each sub-pixel element. In some embodiments the first dichroic filter is located on top of the OLED pixel forming a bandpass of a narrower emission bandwidth than the original emitting elements. In other embodiments the final color filter is itself a dichroic filter, formed of independent narrow bandpass filters for each primary color. Additionally a particle 52 located at the OLED sub-pixel can assist in the recycling of light reflected, whereas an OLED display configured with white OLED sub-pixel elements additionally includes particles adapted to absorb light of unused wavelengths and to re-emit in the desired sub-pixel primary wavelengths.

Dichroic filters have improved performance when light is incoming at a known angle. The layers in the dichroic filter are constructed with an assumed angle of incident light and are most effective when light is entering at this angle, for example perpendicular to the surface of the filter. Therefore, embodiments of the present disclosure include the addition of a collimating structure near the light source, which can be used to enforce a particular angle of incidence on the dichroic filters. The collimating structure functions to funnel light, when placed on top of the light source and having reflective sides (e.g., ESR) that funnel incident light into a selected output angle. The illumination propagated at the selected output angle collimates light onto the dichroic filters. A further benefit is the causing of light from the light source to illuminate a more constrained area of the display, which promotes the capability of regional backlighting. In other embodiments the dichroic filter is constructed with the assumption that light enters the filter at an acute angle of incidence, based on the construction of the light source and the reflective aspects of elements in the recycling assembly. In such embodiments the dichroic filter is designed such that the angle of reflection of the dichroic filters, and other reflective elements in the assembly, is leveraged to steer the light in or near the optimal angle of incidence into the final dichroic filter (e.g., within +/−15 degrees of the nominally optimal angle of incidence). In general, dichroic filter construction can be optimized to be effective over a range of angles of incidence.

In other embodiments the use of inverse prismatic elements in the optical layers (for example including layers known as Backlight Enhancement Film "BEF", Dual Brightness Enhancement Film "DBEF", such as the BEF, DBEF films supplied by 3M Corp.), are arranged between and behind the backlight and display illumination surface, together with other reflective layers behind backlight light guide (such as ESR film-coating supplied by 3M corp), form a recycling assembly and are adapted to refract and reflect light not of preferred angles of incidence to the display illumination surface. The purpose of BEF/DBEF and ESR is to reflect and recycle light not of a desired angle of incidence to the output surface, and to intensify the output of light from display panel, in a cone-like region that matches the typical viewer position. In such embodiments, light rays are recycled within the prismatic-reflecting assembly until emitted in substantially the desired angle of incidence, which is substantially normal to the display illumination surface. In one embodiment the dichroic filter is placed after the enhancement film to leverage the arrival of light entering the dichroic filter already at the optimal angle of the incidence, with respect of the filter surface, as aligned with display output surface.

In one embodiment the layers of the dichroic filter are constructed so as to reflect and refract selected wavelengths along a selected angle of incidence, at a normal to the dichroic filter plane. In other embodiments the layers are constructed so as to reflect and refract designed wavelengths at an angle other than the normal of the dichroic filter plane, but substantially along a pre-determined angle of incidence. An example of this is where a dichroic filter layer is coated on a surface of a light-guide assembly, which is designed to accept light at an angle to the transmission path, and direct it towards the selected path.

In other embodiments a dichroic filter is layered on top of the reflective element so as to refract light not of selected wavelengths, into a steeper angle of incidence within the Backlight Reflector (ESR) & Enhancement Layers (BEF/DBEF), enhancing the recycling of light not of the selected pass-band, between ESR, DBEF/BEF and light wavelength conversion material. In other embodiments a dichroic filter and light wavelength conversion material, are layered on top of the reflective element so as to absorb, convert and re-emit light not of selected wavelength, while reflecting light of the selected wavelength towards the angle of display emission.

Figure 10:
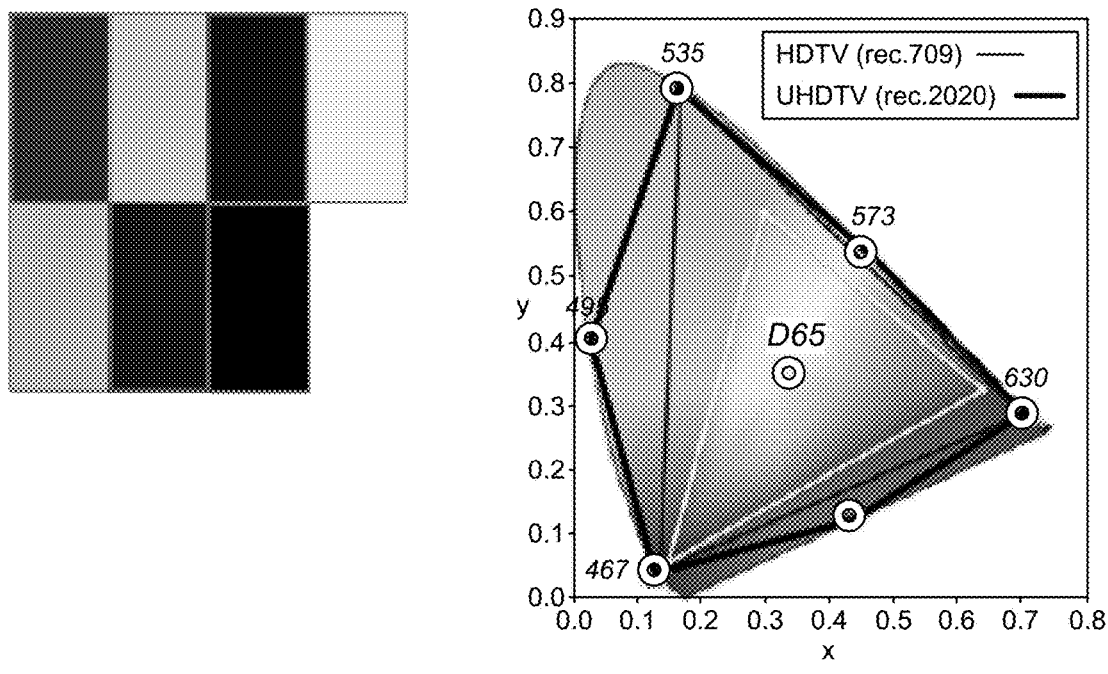
FIG. 10 is a diagram depicting a color gamut of a light source including five primary colors, along with the passbands of a multi-band reflective filter according to an embodiment of the present disclosure.
Figure 10:
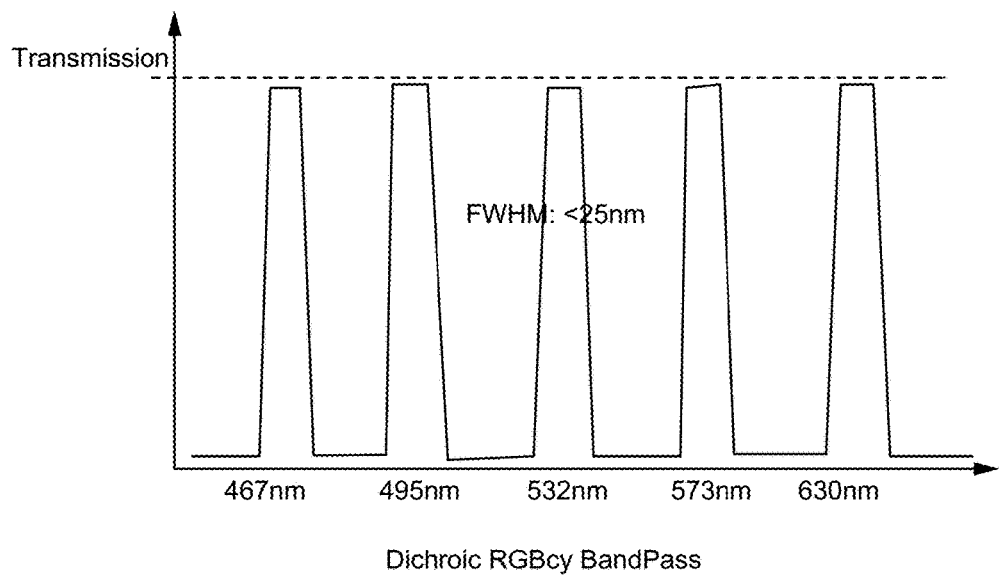

While embodiments thus described have mainly been described in the context of a display having three primary colors, a greater (or lesser) number of primaries are possible and consistent with the invention. Referring now to FIG. 10, an embodiment of a multi-bandpass filter includes narrow passbands for five primary wavelengths, centered at 467, 495, 532, 573, and 630 nm (e.g., red, green, blue, cyan, and yellow primaries). A benefit of an increased number of primaries is a wider gamut of color representation for a display. A filter such as shown in FIG. 10 is consistent with the aforementioned embodiments.

The foregoing description, for purpose of explanation, has been described with reference to specific embodiments. However, the illustrative discussions above are not intended to be exhaustive or to limit the invention to the precise forms disclosed. Many modifications and variations are possible and contemplated in view of the above teachings, including combinations of embodiments not explicitly recited as such. The embodiments were chosen and described in order to explain the principles of the invention and its practical applications, to thereby enable others skilled in the art to utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A light recycling assembly for enhancing spectral purity of transmitted light of a display, comprising:
    a first reflective filter disposed in a light path of a light source and operable to transmit light only over a multi-band of wavelengths, wherein the multi-band includes a finite number of bands of wavelengths spanning substantially non-overlapping ranges, and to reflect wavelengths not of the multi-band;
    a conversion element comprising at least one conversion particle, disposed to receive reflected light from the first reflective filter, and operable to absorb light at a first conversion wavelength and to emit light at a wavelength of the multi-band; and
    a photovoltaic conversion element including a particle operable to absorb light at a second conversion wavelength band and to convert at least a portion of the second conversion wavelength light into electrical energy.

2. The light recycling assembly of claim 1, further comprising a reflecting element disposed to receive emitted light of the conversion element and reflected wavelengths of the first reflective filter, and operable to direct reflected light toward the first reflective filter.

3. The light recycling assembly of claim 2, wherein the light source comprises a photon pump operable to emit at photon pump wavelengths, and wherein the reflecting element comprises a second reflective filter operable to transmit a second passband of wavelengths that comprises photon pump wavelengths and to reflect wavelengths not of the second passband.

4. The light recycling assembly of claim 3 wherein the conversion element comprises a first particle adapted to absorb at least a portion of the photon pump wavelengths and to emit light at conversion wavelengths other than the photon pump wavelengths, and a second particle adapted to absorb light of the conversion wavelengths and to emit light at a wavelength of the multi-band.

5. The light recycling assembly of claim 3 wherein the first reflective filter, the conversion element, and the reflecting element are substantially parallel and form an arrangement adjacent to the light source.

6. The light recycling assembly of claim 3, wherein the light source is disposed in a housing, and further wherein the housing comprises the reflecting element.

7. The apparatus of claim 1 wherein the first reflective filter comprises a dichroic filter.

8. A method of recycling light for enhancing the spectral purity of transmitted light of a display, comprising:
    transmitting light only over a multi-band of wavelengths by a first reflective filter disposed in a light path of a light source, wherein each band in the multi-band is centered on a wavelength corresponding to a primary color of the display;
    reflecting wavelengths not of the multi-band, by the first reflective filter,
    receiving reflected light from the first reflective filter by a conversion element comprising at least one conversion particle;
    absorbing light at a first conversion wavelength;
    emitting light at a wavelength of the multi-band;
    absorbing light at a photovoltaic conversion wavelength; and converting at least a portion of the photovoltaic conversion wavelength light into electrical energy, by a photovoltaic conversion element.

9. The method of claim 8, further comprising directing reflected light toward the first reflective filter by a reflecting element disposed to receive emitted light of the conversion element and reflected wavelengths of the first reflective filter.

10. The method of claim 9, wherein the light source comprises a photon pump emitting at photon pump wavelengths, and wherein the reflecting element comprises a second reflective filter transmitting a second passband of wavelengths that comprises photon pump wavelengths and reflecting wavelengths not of the second passband.

11. The method of claim 10 wherein the conversion element comprises a first particle absorbing at least a portion of the photon pump wavelengths and emitting light at conversion wavelengths other than the photon pump wavelengths, and a second particle absorbing light of the conversion wavelengths and emitting light at a wavelength of the multi-band.

12. The method of claim 10 wherein the first reflective filter, the conversion element, and the reflecting element are substantially parallel and form an arrangement adjacent to the light source.

13. The method of claim 9, wherein the light source is disposed in a housing, and further wherein the housing comprises the reflecting element.

14. The method of claim 8 wherein the first reflective filter comprises a dichroic filter.

15. An apparatus for enhancing spectral purity of transmitted light, comprising:
a housing;
a light source disposed in the housing, having a fixed spectrum and an output surface operable to output light; and
a reflective filter disposed in the housing adjacent to the output surface, and operable to pass only a first multi-band of wavelengths of transmitted light, wherein the first multi-band includes a finite number of substantially non-overlapping bands of wavelengths, each band centered on a wavelength corresponding to a primary color of a display, and to reflect wavelengths not of the first multi-band.

16. The apparatus of claim 15 wherein the first multi-band of wavelengths comprises visible wavelengths.

17. The apparatus of claim 16 wherein the light source is adapted to emit light over a broad emission spectrum.

18. The apparatus of claim 15, wherein the passband amplitude for passbands of the first multi-band is selected according to a predetermined luminance ratio of the first multi-band wavelengths.

19. The apparatus of claim 15, wherein a predetermined luminance ratio of the first multi-band wavelengths is generated according to wavelength-specific reflectivity constants of the reflective filter for wavelengths not of the first multi-band.

20. The apparatus of claim 15, wherein the housing comprises an energy recycling element comprising at least one conversion material disposed to receive reflected light from the reflective filter, and operable to absorb and to convert light at a first wavelength into electrical energy.

21. The apparatus of claim 15, wherein the housing comprises a recycling element including at least one conversion material disposed to receive reflected light from the reflective filter, and operable to absorb light at a first wavelength and to emit recycled light at a second wavelength.

22. The apparatus of claim 21, wherein the housing comprises a reflecting element disposed to receive reflected wavelengths of the reflective filter and the recycled light.

23. The apparatus of claim 22, wherein the reflecting element is disposed to direct light toward the recycling element.

24. The apparatus of claim 22, wherein the reflecting element is disposed to direct light toward an output surface of the reflective filter.

25. The apparatus of claim 21, further comprising a second reflective filter placed after the recycling element wherein the second reflective filter is adapted to permit the first multi-band of wavelengths, wherein the first multi-band corresponds with visible wavelengths.

26. The apparatus of claim 21, wherein the conversion material comprises at least one particle exhibiting one of the Stokes effect and the Anti-Stokes effect, the recycling element adapted to absorb light not of the first multi-band of wavelengths, and to convert at least a portion of the absorbed light into a wavelength of the first multi-band of wavelengths.

27. The apparatus of claim 26, wherein the conversion material comprises one of: phosphors; fluorophores; luminophores; chromaphores; and quantum dot particles.

28. The apparatus of claim 15 wherein the reflective filter is deposited on an interior surface of the housing.

29. The apparatus of claim 15, wherein a second multi-band of wavelengths is permitted to pass through the reflective filter.

30. The apparatus of claim 15 wherein the light source is selected from one of an LED, an OLED, an electroluminescent light, a cold-cathode fluorescent light, a laser, an incandescent light, and a fluorescent light.

31. The apparatus of claim 15, further comprising a photovoltaic conversion element including a particle operable to absorb light at a conversion wavelength band and to convert at least a portion of the conversion wavelength light into electrical energy.

32. The apparatus of claim 15 wherein the reflective filter comprises a dichroic filter.

* * * * *